United States Patent
Uematsu et al.

(10) Patent No.: US 8,710,606 B2
(45) Date of Patent: Apr. 29, 2014

(54) OPTICAL SENSOR AND ELECTRONIC APPARATUS

(75) Inventors: Akira Uematsu, Suwa (JP); Yoshiyuki Terashima, Matsumoto (JP); Yoichi Sato, Suwa (JP); Atsushi Matsuo, Tachikawa (JP)

(73) Assignee: Seiko Epson Corporation, Tokyo (JP)

( * ) Notice: Subject to any disclaimer, the term of this patent is extended or adjusted under 35 U.S.C. 154(b) by 225 days.

(21) Appl. No.: 13/421,212

(22) Filed: Mar. 15, 2012

(65) Prior Publication Data

US 2012/0235269 A1 Sep. 20, 2012

(30) Foreign Application Priority Data

Mar. 16, 2011 (JP) .................. 2011-058182

(51) Int. Cl.
*H01L 31/0232* (2006.01)
(52) U.S. Cl.
CPC ................. *H01L 31/0232* (2013.01)
USPC ............. 257/432; 257/E31.127; 438/69
(58) Field of Classification Search
USPC ............... 257/432, E31.127; 438/69
See application file for complete search history.

(56) References Cited

U.S. PATENT DOCUMENTS

| 2006/0186547 | A1 | 8/2006 | Wang et al. |
| 2006/0285005 | A1 | 12/2006 | Inaba et al. |
| 2011/0183460 | A1 | 7/2011 | Wang et al. |
| 2011/0216315 | A1* | 9/2011 | Uematsu et al. .............. 356/326 |

FOREIGN PATENT DOCUMENTS

| JP | A-06-129908 | 5/1994 |
| JP | A-2006-237576 | 9/2006 |
| JP | A-2006-351800 | 12/2006 |

* cited by examiner

*Primary Examiner* — Julio J. Maldonado
*Assistant Examiner* — Daniel Shook
(74) *Attorney, Agent, or Firm* — Oliff PLC

(57) ABSTRACT

An optical sensor includes an impurity region for a photodiode and an angle limiting filter limiting the incidence angle of incidence light incident to a light receiving area of the photodiode, which are formed on a semiconductor substrate. The angle limiting filter is formed by at least a first plug corresponding to a first insulating layer and a second plug corresponding to a second insulating layer located in an upper layer of the first insulating layer. Between the first plug and the second plug, there is a gap area having a gap space that is equal to or less than λ/2.

20 Claims, 17 Drawing Sheets

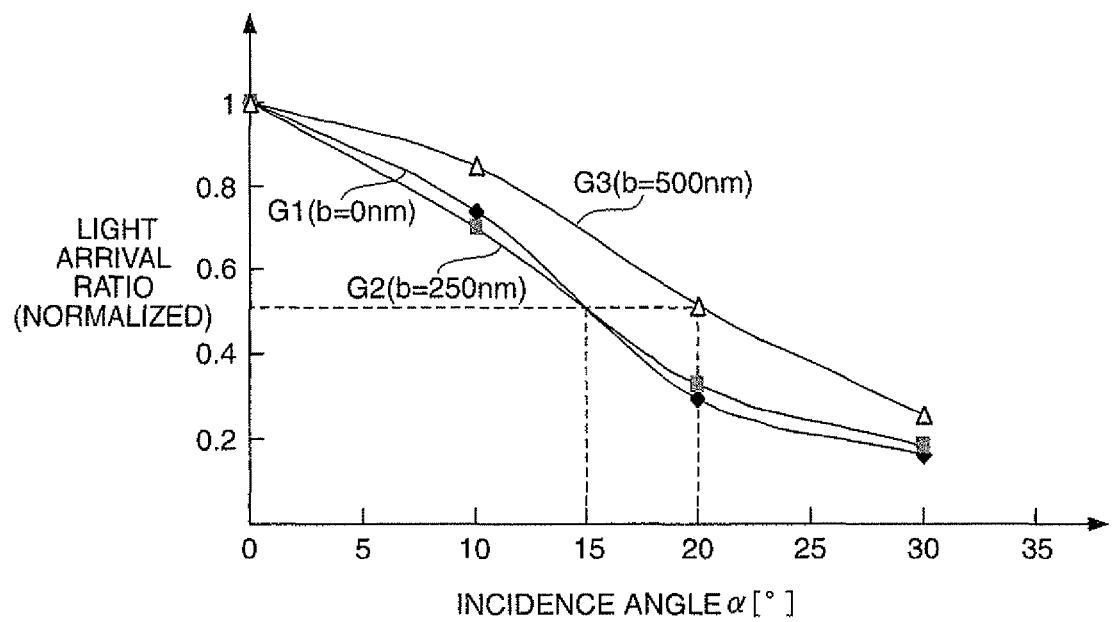
FIG. 7
FIG. 8A
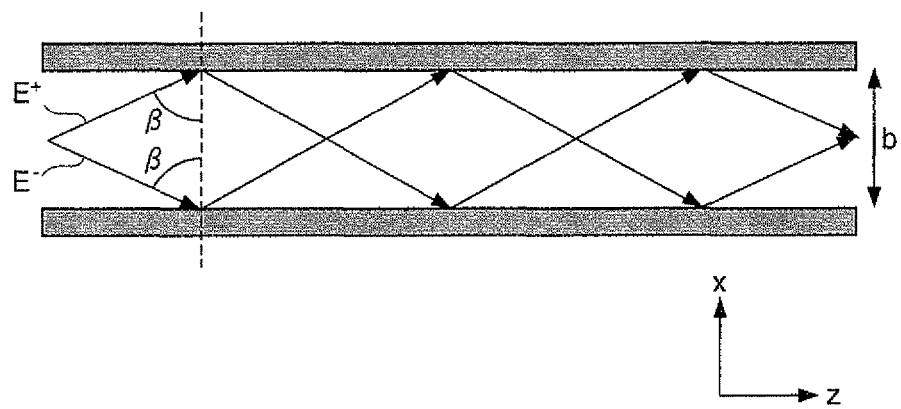
FIG. 8B
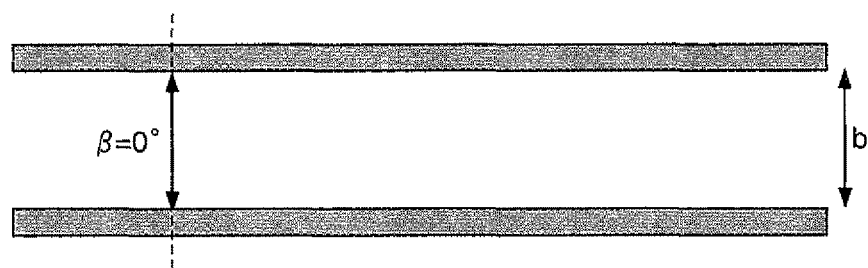

FIG. 9A
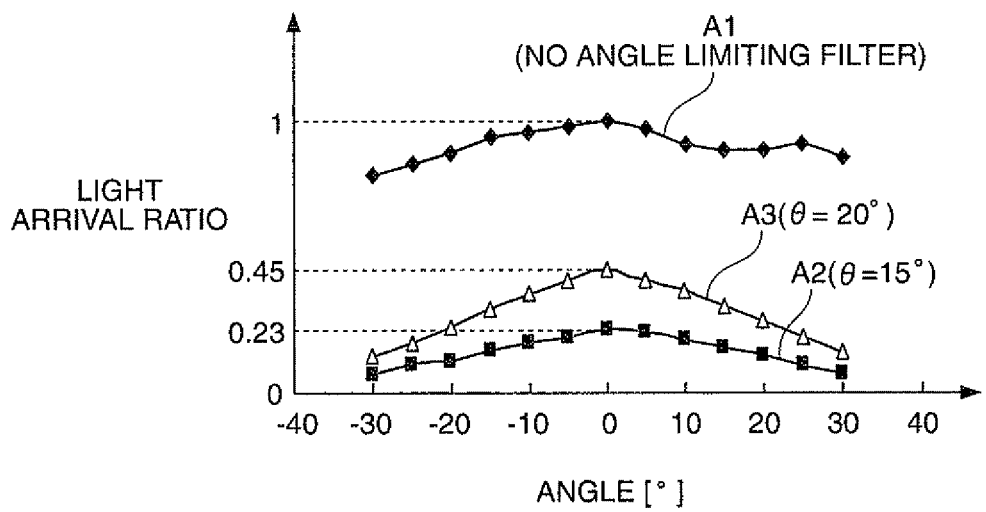
FIG. 9B
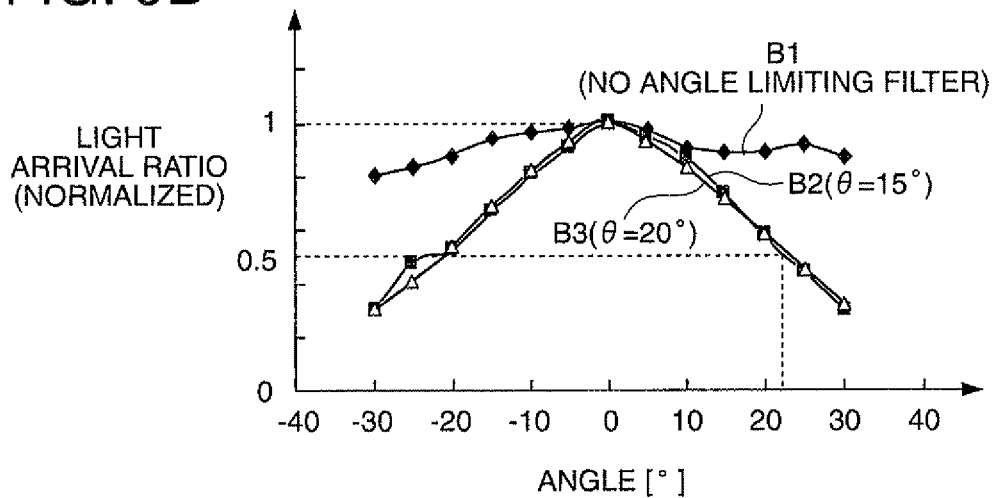
FIG. 9C
| $d^2/\lambda R$ | 0.72 | 1.32 |
|---|---|---|
| $\theta$ (d) | 15° | 20° |
| HALF-VALUE ANGLE | 22.5°~23° | 21°~22.5° |
| LIGHT ARRIVAL RATIO | 22.9% | 44.8% |

FIG. 10A
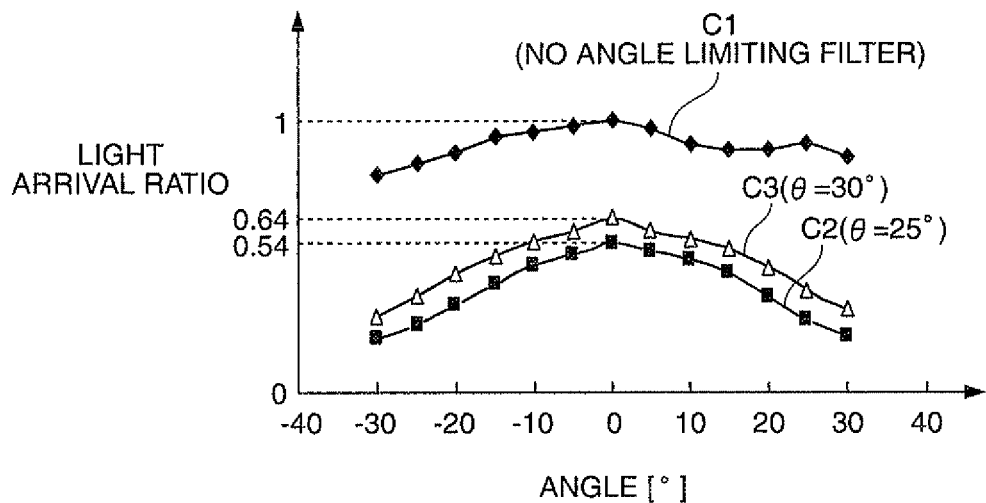
FIG. 10B
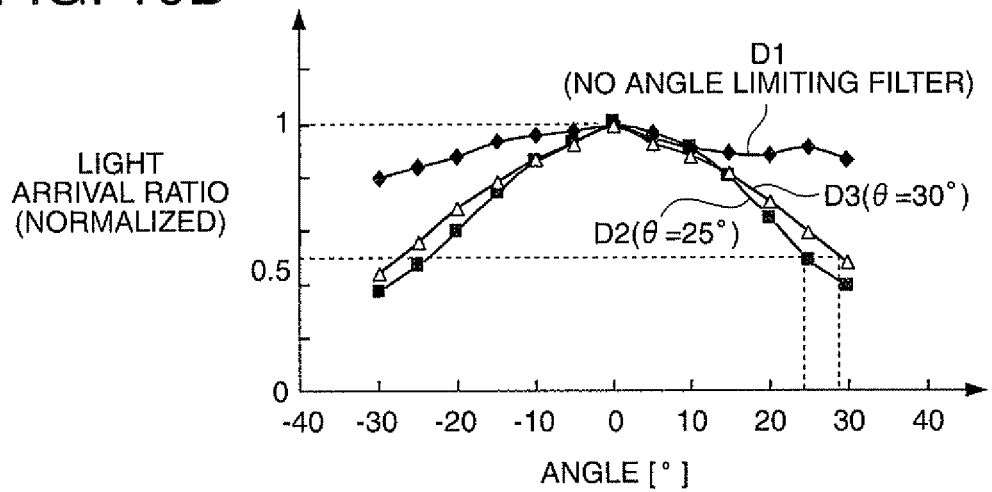
FIG. 10C
| $d^2/\lambda R$ | 2.17 | 3.34 |
|---|---|---|
| $\theta$ (d) | 25° | 30° |
| HALF-VALUE ANGLE | 24°~25° | 28°~29° |
| LIGHT ARRIVAL RATIO | 54.4% | 64.1% |

OPTICAL SENSOR AND ELECTRONIC APPARATUS

The entire disclosure of Japanese Patent Application No. 2011-058182, filed Mar. 16, 2011 is expressly incorporated by reference herein.

BACKGROUND

1. Technical Field

The present invention relates to an optical sensor, an electronic apparatus, and the like.

2. Related Art

Recently, measurement using an optical sensor has been applied to various fields. For example, in order to diagnose or test target objects, spectral sensors are used. As such spectral sensors, there are pulse oximeters that measure the oxygen saturation in blood by using the light absorption of hemoglobin and saccharimeters that measure the sugar content of a fruit by using light absorption of sugar. In addition, illuminance sensors that are used for measuring the illuminance and the like are used.

JP-A-6-129908 and JP-A-2006-351800 are examples of the related art.

Among such optical sensors, there are optical sensors that limit the incident angle of incidence light by using an angle limiting filter (for example, JP-A-6-129908). However, in a case where a gap area is generated on the side wall of the angle limiting filter, there is a problem in that incidence light leaks from the gap area so as to degrade the angle controllability. For example, the angle limiting filter may be considered to be miniaturized by forming the angle limiting filter through a semiconductor process. In such a case, there is a problem in that the number of processes is increased when the gap area is to be filled, which complicates the process.

SUMMARY

An advantage of some aspects of the invention is that it provides an optical sensor, an electronic apparatus, and the like capable of limiting the incidence angle with high precision even in a case where there is a gap area on the side wall.

An aspect of the invention is directed to an optical sensor including: an impurity region, which is formed on a semiconductor substrate, used for a photodiode; and an angle limiting filter that limits an incidence angle of incidence light incident to a light receiving area of the photodiode. The angle limiting filter is formed at least by a first plug corresponding to a first insulating layer and a second plug corresponding to a second insulating layer that is located in an upper layer of the first insulating layer, and, in a case where a wavelength of the incidence light is denoted by λ, a gap area having a gap space that is equal to or less than λ/2 is arranged between the first plug and the second plug.

According to the above-described optical sensor, between the first plug and the second plug forming the angle limiting filter, a gap area having a space that is equal to or less then λ/2 is disposed. Thus, the incidence angle of incidence light incident to the light receiving area of the photodiode is limited by the angle limiting filter in which the gap area is arranged. Accordingly, even in a case where there is a gap area in the angle limiting filter, the incidence limitation angle of the incidence light can be controlled with high precision.

The above-described optical sensor may be configured such that the first insulating layer is an insulating layer that is disposed between a first metal layer and a second metal layer that is located in an upper layer of the first metal layer, the second insulating layer is an insulating layer that is disposed between the second metal layer and a third metal layer that is located in an upper layer of the second metal layer, and the second metal layer is a metal layer having a thickness larger than that of the first metal layer.

By forming the second metal layer to be thicker than the first metal layer, there is a case where a gap area is generated between the first plug and the second plug. According to the above-described optical sensor, even in such a case, by configuring the gap space to be equal to or less than λ/2, light does not leak from the gap area, whereby the degradation of precision of an angle control process can be suppressed.

The above-described optical sensor may be configured such that a processing circuit that is a circuit processing an output signal of the photodiode and of which a wiring is formed at least by the first to third metal layers and the first and second plugs is further included, and the first plug and the second plug that form the angle limiting filter are formed through a process of forming a wiring layer of the processing circuit.

In such a case, the angle limiting filter and the wiring layer of the processing circuit can be formed through the same wiring forming process. Accordingly, a process of forming the angle limiting filter does not need to be separately prepared, whereby the process can be simplified.

In the above-described optical sensor, the processing circuit may include a capacitor having an MIM (Metal Insulator Metal) structure that is formed in the second insulating layer corresponding to the second plug.

In the above-described optical sensor, the capacitor having the MIM structure may be a capacitor that has the second metal layer as a lower electrode and has a metal layer that is formed between the second metal layer and the third metal layer as an upper electrode.

When over-etching is performed in the process of etching the second insulating film so as not to generate a gap space between the first plug and the second plug, there is a case where the second plug penetrates the upper electrode of the MIM-type capacitor. According to the above-described optical sensor, even in such a case, by arranging the gap area having a gap space of λ/2, the penetration of the upper electrode can be suppressed.

In the above-described optical sensor, the first plug and the second plug that form the angle limiting filter may be light shielding materials formed through a semiconductor process on the impurity region for the photodiode.

In such a case, since the constituent elements of the optical sensor can be formed through a semiconductor process, the size of the optical sensor can be decreased.

In the above-described optical sensor, in a case where a wavelength of the incidence light is denoted by λ, a height of the angle limiting filter is denoted by R, and a width of an opening of the angle limiting filter is denoted by d, "$d^2/\lambda R \geq 2$" may be satisfied.

In such a case, the angle limiting filter having the size that satisfies "$d^2/R \geq 2$" is formed. Accordingly, the incidence angle of the incidence light can be limited to a desired limitation angle, and the light arrival ratio can be improved.

In the above-described optical sensor, an optical band pass filter that transmits light of a specific wavelength out of the incidence light may be further included.

In such a case, light of a specific wavelength out of the incidence light can be allowed to be incident to the angle limiting filter and the light receiving area of the photodiode.

In the above-described optical sensor, the optical band pass filter may be formed by a multi-layer thin film that is tilted at an angle corresponding to a transmission wavelength with respect to a light receiving face of the photodiode.

The above-described optical sensor may be configured such that the optical band pass filter is formed by a plurality of sets of multi-layer thin films having mutually different transmission wavelengths, and the plurality of sets of multi-layer thin films has tilt angles with respect to the light receiving face in accordance with the transmission wavelengths and is formed through a simultaneous thin-film forming process.

In such a case, the optical band pass filter is formed by a multi-layer thin film, and the transmission wavelength can be set in accordance with the tilt angle of the multi-layer thin film. In addition, a plurality of multi-layer thin films having mutually different transmission wavelengths can be simultaneously formed.

The optical sensor may be a spectroscopic sensor that is used for spectrally dispersing the incidence light.

The optical sensor may be an illuminance sensor that is used for measuring illuminance of the incidence light.

The optical sensor may be an elevation angle sensor that is used for measuring an elevation angle of a light source.

Another aspect of the invention is directed to an electronic apparatus that includes any of the above-described optical sensor.

BRIEF DESCRIPTION OF THE DRAWINGS

The invention will be described with reference to the accompanying drawings, wherein like numbers reference like elements.

FIG. 7 is a result of simulations of a light arrival ratio with respect to the incidence angle.

FIGS. 8A and 8B are schematic diagrams showing the principles of this embodiment.

FIGS. 9A to 9C are examples of angle characteristics of the light arrival ratio in the comparative example.

FIGS. 10A to 10C are examples of angle characteristics of the light arrival ratio according to this embodiment.

DESCRIPTION OF EXEMPLARY EMBODIMENTS

Hereinafter, preferred embodiments of the invention will be described in detail. However, the embodiments described below are not for the purpose of limiting the scope of the invention described in the appended claims, and it cannot be determined that all the configurations described in the embodiments are essential as solving means according to the embodiments of the invention. In addition, although an example will be described below in which the optical sensor is a spectroscopic sensor, the optical sensor according to the embodiments is not limited to a spectroscopic sensor as will be described later.

1. Configuration

Figure 1:
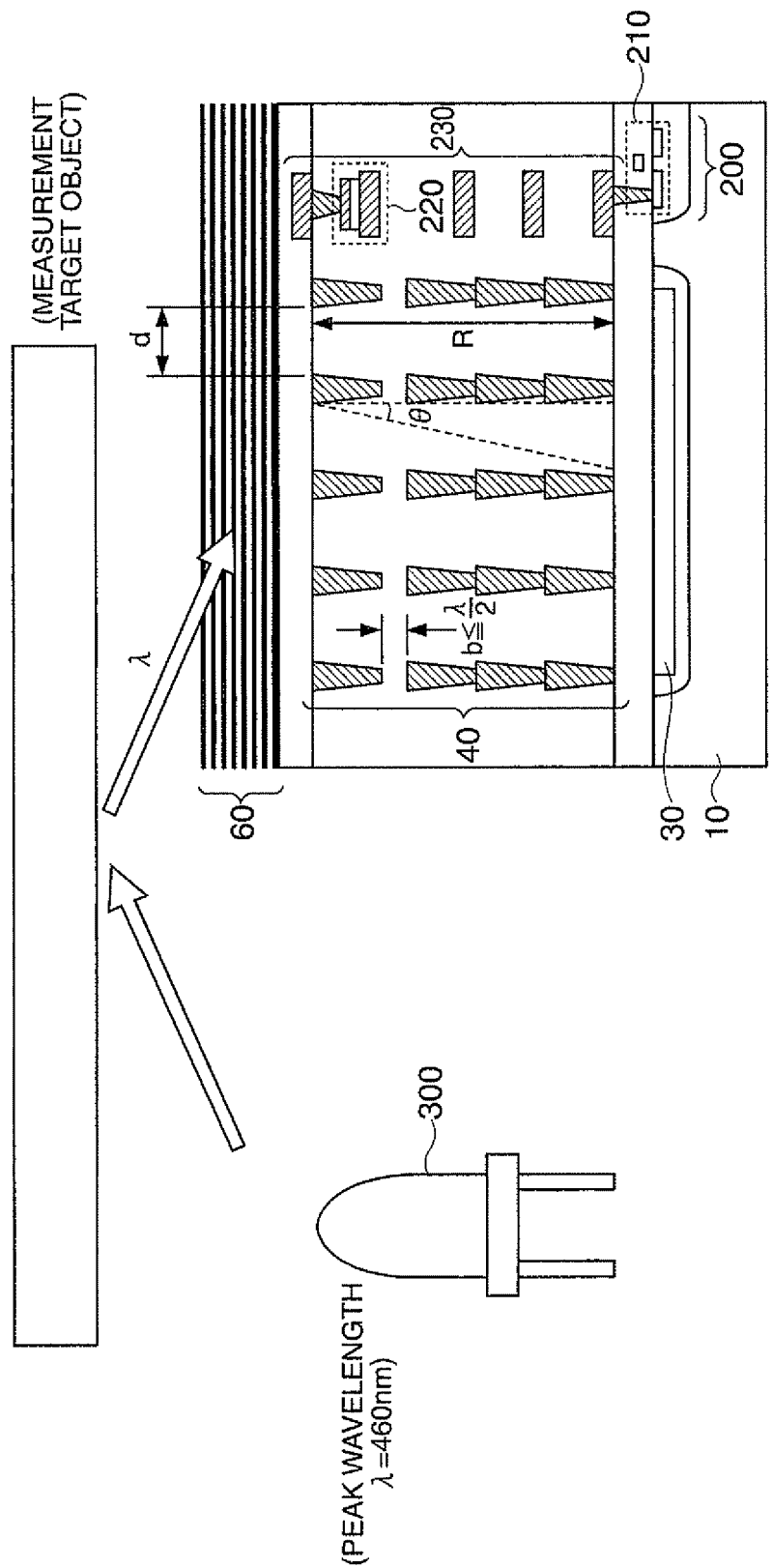
FIG. 1 is a configuration example of an optical sensor according to an embodiment.

FIG. 1 shows a configuration example of a spectroscopic sensor according to this embodiment. Hereinafter, for the simplification, the configuration of this embodiment will be schematically shown, and the dimensions and the ratios illustrated in the figures are not real values.

FIG. 1 shows a cross-sectional view of a spectroscopic sensor taken along a plane perpendicular to the plane of a semiconductor substrate 10. The spectroscopic sensor includes the semiconductor substrate 10, a photodiode 30 (a photosensor or an impurity region of a photodiode in a broad sense), an angle limiting filter 40, an optical band pass filter 60 (a multi-layer film filter or a dielectric filter), and a peripheral circuit 200.

The photodiode 30 and the angle limiting filter 40, as will be described later, are formed on the semiconductor substrate 10 through a semiconductor process. Here, "on the semiconductor substrate 10" represents a side on which the angle limiting filter 40 and the like are formed in a direction perpendicular to the plane of the semiconductor substrate 10.

The angle limiting filter 40, for example, is formed in a lattice pattern in the plan view and limits the incidence angle of the incidence light incident to the photodiode 30. In particular, the angle limiting filter 40 is formed from a material (for example, a tungsten plug) that has a light shielding property for a wavelength detected by the photodiode and shields lights such that light having an incidence angle larger than a limiting angle θ [°] is not incident to the photodiode 30.

On the side wall of the angle limiting filter 40, a gap area having a gap space of b [nm] that satisfies the following Equation (I) is open. Here, λ [nm] is the wavelength of the incidence light incident to the angle limiting filter 40. This gap area, as will be described later, is generated in a wiring forming process of the semiconductor process and the following Equation (1) is satisfied by controlling a plug forming etching process and the like. Hereinafter, the gap area will be simply referred to as a gap as is appropriate. In addition, the gap space will be simply referred to as a space as is appropriate.

$$b \geq \lambda/2 \tag{1}$$

Figure 2:
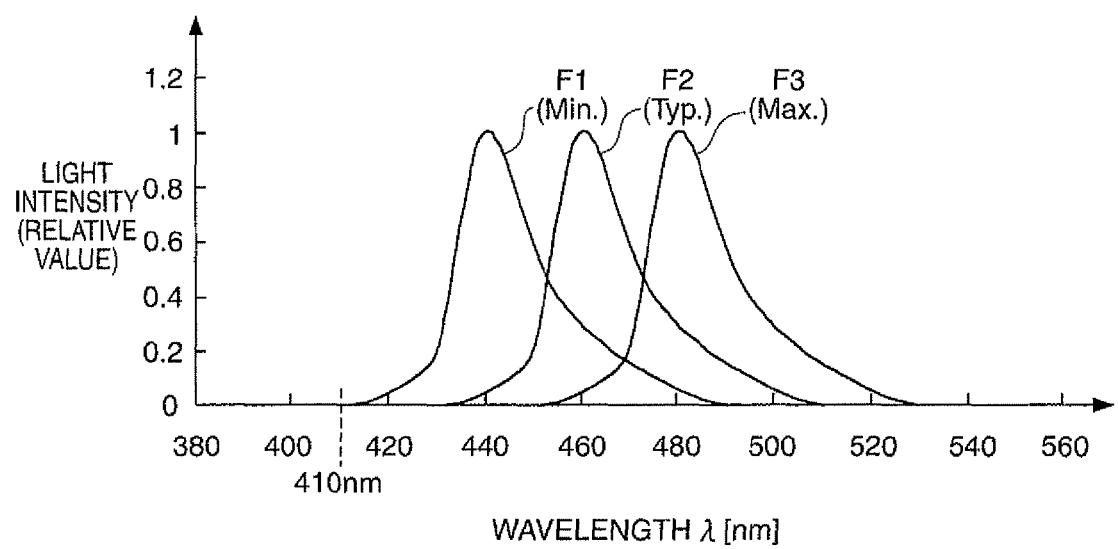
FIG. 2 is an example of the spectrum of a blue LED.

The incidence light incident to the angle limiting filter 40 is acquired by emitting light, for example, of a blue LED 300 (a light source in a broad term) onto a measurement target object so as to be reflected or scattered by the measurement target object. FIG. 2 shows an example of the spectrum (wavelength characteristics) of the blue LED 300. In FIG. 2, F1 illustrates a case of minimum process variation, F2 illustrates a case of typical process variation, and F3 illustrates a case of maximum process variation. As shown in FIG. 2, the shortest wavelength λmin that can be incident to the angle limiting filter 40 is 410 nm. In such a case, the gap space is set as the following Equation (2).

$$b \geq \lambda min/2 = 205 \text{ nm} \tag{2}$$

The optical band pass filter 60 is formed by a multi-layer thin film stacked on the angle limiting filter 40. As will be described later, by limiting the incidence angle by using the angle limiting filter 40, the transmissive wavelength band of the optical band pass filter 60 is limited, whereby spectroscopic characteristics of desired wavelength resolution can be acquired.

The peripheral circuit 200 is a circuit that is formed on the semiconductor substrate 10, and for example, processes a signal detected by the photodiode 30. The Peripheral circuit 200 includes a transistor 210, a wiring 230, and a MIM (Metal Insulator Metal) type capacitor 220 that is formed between metal layers included in the wiring 230. Through a process of forming the wiring 230 and the MIM-type capacitor 220, the angle limiting filter 40 is formed.

According to the embodiment described above, by forming the angle limiting filter 40 through the semiconductor process, the size of the optical sensor can be decreased. However, in a case where a gap is configured not to be generated on the side wall of the angle limiting filter 40 in the semiconductor process, there is a problem in that the process becomes complicated. From this point, according to this embodiment, by allowing a space of gap b≤λ/2, the process can be simplified, and accordingly, light does not leak from the gap.

2. Simplification of Process

The simplification of the process will be described with reference to a comparative example. Non leaking of light according to the condition of the gap b≤λ/2 will be described later.

Figure 3:
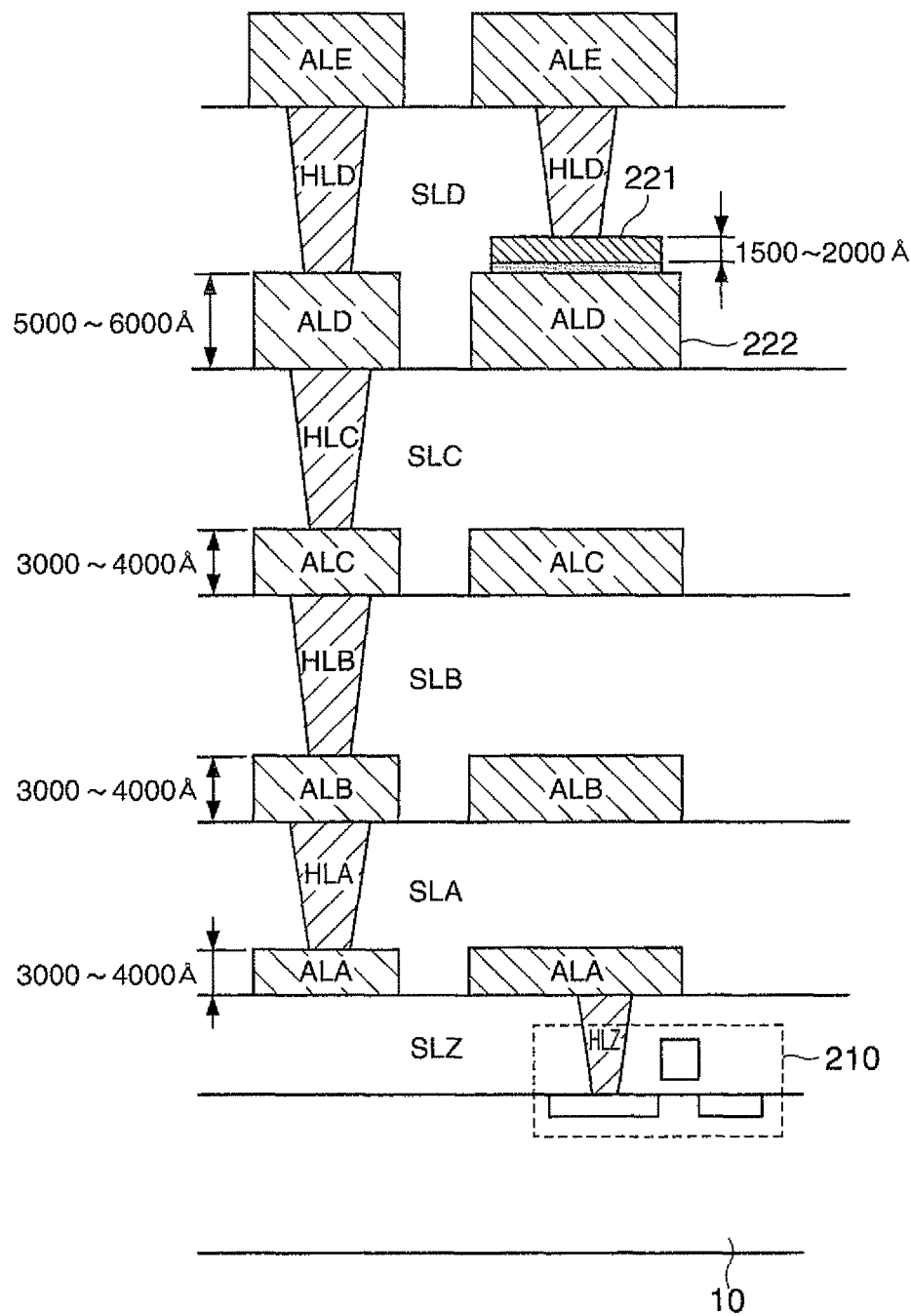
FIG. 3 is a schematic diagram showing a general semiconductor process.

First, a general semiconductor process will be described with reference to FIG. 3. As shown in FIG. 3, on the semiconductor substrate 10, a transistor 210, an insulating layer SLZ (oxide film), a tungsten plug HLZ (conductive plug), aluminum layers ALA to ALE (metal layer), insulating layers SLA to SLD (oxide film), and tungsten plugs HLA to HLD (conductive plugs) are formed.

The insulating layer SLZ insulates between the aluminum layer ALA and the transistor 210. The plug HLZ connects the aluminum layer ALA and the diffusion layer of the transistor 210 to each other. The insulating layers SLA to SLD insulates between the layers of the aluminum layers ALA to ALE. The plugs HLA to HLD connect the layers of the aluminum layers ALA to ALE.

Between the aluminum layer ALE located in the uppermost layer and the aluminum layer ALD located in a layer lower than the uppermost layer by one layer, an upper electrode 221 of an MIM-type capacitor is formed. The lower electrode 222 of the MIM-type capacitor is formed by the aluminum layer ALD. The upper electrode 221 is formed by an MIM metal layer, and an insulating film (dielectric body) formed from $SiO_2$ or the like is formed between the upper electrode 221 and the lower electrode 222. The upper electrode 221 is connected to the aluminum layer ALE through the plug HLD.

Figure 4:
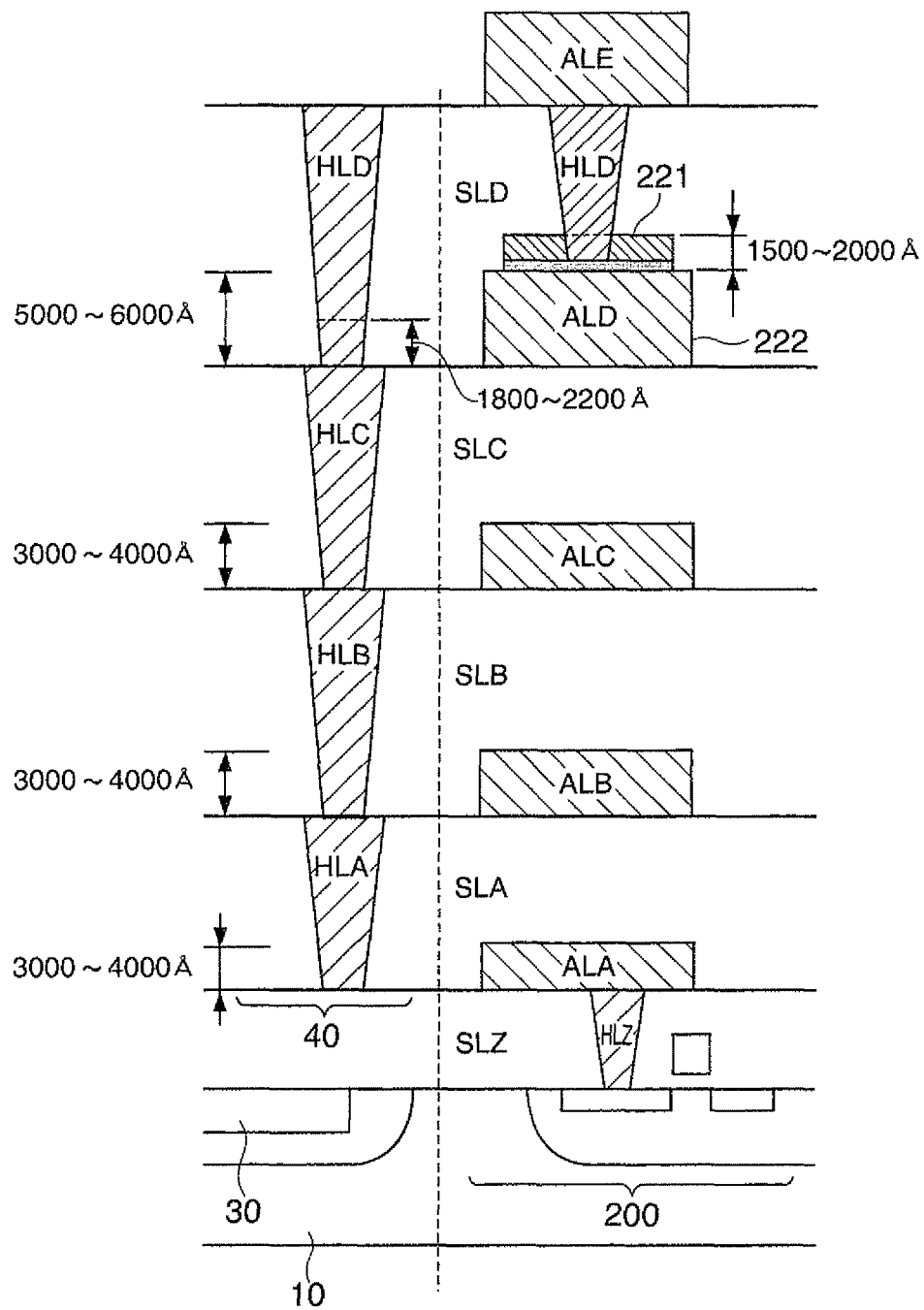
FIG. 4 is a schematic diagram showing a semiconductor process of a comparative example.

FIG. 4 shows a comparative example of this embodiment. In this comparative example, the plug HLD is over etched so as to be connected to the plug HLC. In FIG. 4, although one side wall of the angle limiting filter 40 is shown, the other side wall is similarly arranged.

As shown in FIG. 4, the side wall of the angle limiting filter 40 is formed by the plugs HLA to HLD. Holes used for filling in the plugs HLA to HLD are formed by etching the insulating layers SLA to SLD. While, generally, the etching is stopped by the aluminum layers ALA to ALE serving as stoppers, there is no aluminum layers ALA to ALE in the angle limiting filter 40, and accordingly, the holes are etched to be deeper than those of a general case by 3000 to 4000 Å. Since the thickness of the aluminum layers ALA to ALC is 3000 to 4000 Å, the plugs HLB and HLC reach the plug located in the lower layer.

On the other hand, since the thickness of the aluminum layer ALD is 5000 to 6000 Å, the hole of the plug HLD is not etched up to the plug located in the lower layer. Accordingly, between the plug HLD and the plug HLC, a gap of 1800 to 2200 Å is open. In order to fill in the gap, additional over-etching of 1800 to 2200 Å is required. However, the plug HLD penetrates the upper electrode 221 of the MIM-type capacitor through over-etching, whereby a trouble such as formation of a short occurs. In order to avoid such penetration according to over-etching, it is necessary to separately prepare masks of the angle limiting filter 40, the peripheral circuit 200, and the plug HLD and to perform etching in different processes.

As above, in a case where the side wall of the angle limiting filter 40 is formed as a tungsten plug, and there is no gap between the plugs, the number of processes is increased, whereby there is a problem in that the process becomes complicated.

From that point, according to this embodiment, by arranging a gap of a space b≤λ/2 through which the incidence light does not leak between the plug HLD and the plug HLC, the process can be simplified. In other words, it is not necessary to separately prepare the masks of the angle limiting filter 40, the peripheral circuit 200, and the plug HLD, and accordingly, the side wall of the angle limiting filter 40 can be formed through a general wiring forming process.

The semiconductor process according to this embodiment will be described in detail with reference to FIG. 5. Hereinafter, the case of b≤λmin/2=205 nm (2050 Å) that has been described above with reference to FIG. 2 will be described as an example.

Figure 5:
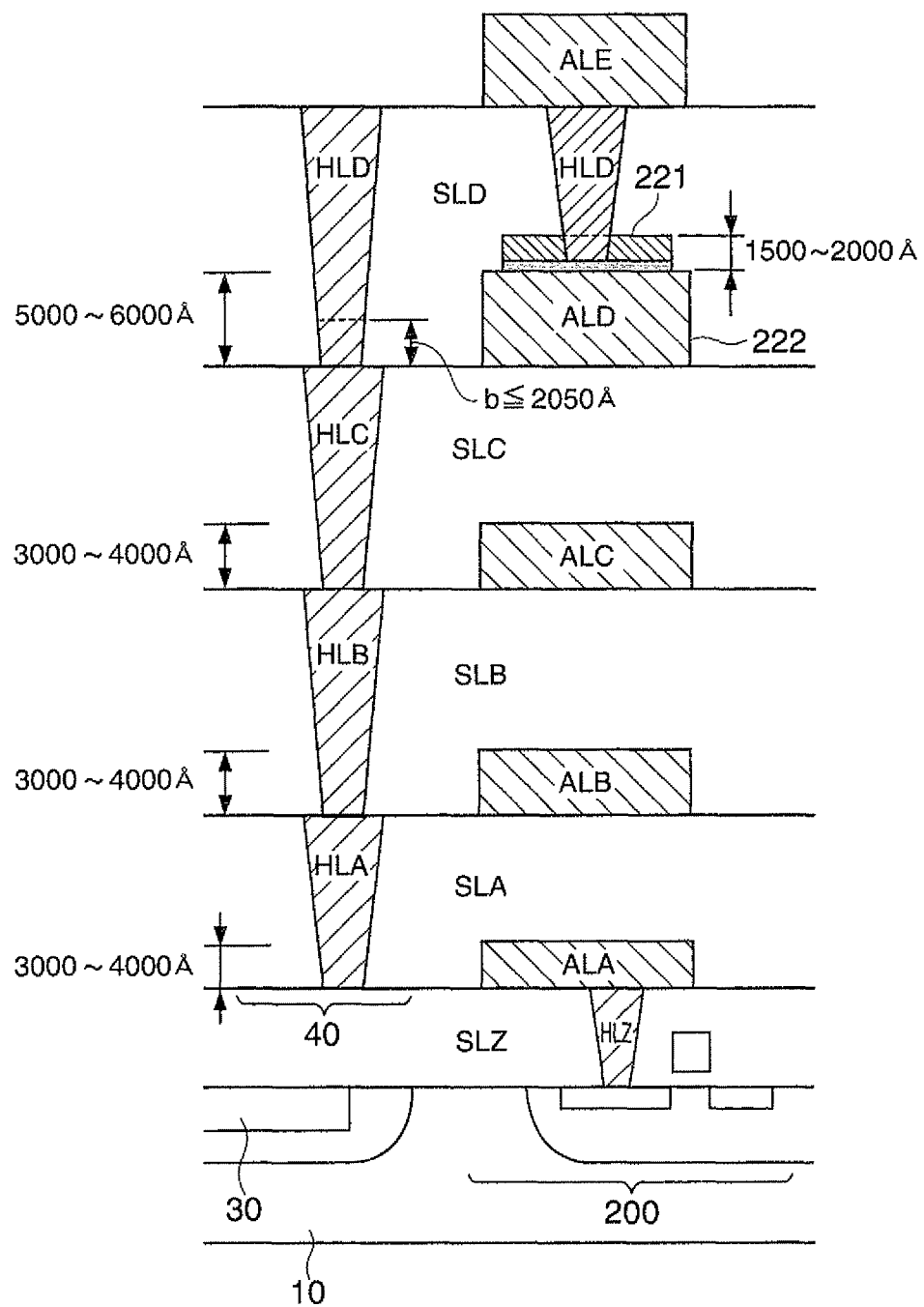
FIG. 5 is a schematic diagram showing a semiconductor process according to an embodiment.

As shown in FIG. 5, the side wall of the angle limiting filter 40 is formed by the plugs HLA to HLD. The plugs HLB and HLC are connected to a plug located in the lower layer through a process similar to the process described above with reference to FIG. 4. On the other hand, an etching process, in which the hole of the plug HLD is formed, is performed by the etching of 3000 to 4000 Å described above with reference to FIG. 4 and additional etching of 150 Å. Through the etching of 3000 to 4000 Å, a space between the lower end of the plug HLD and the upper end of the plug HLC is 1800 to 2200 Å. In addition, through the additional etching of 150 Å, the space is smaller than 2050 Å so as to satisfy the condition of space b≤2050 Å. Since the thickness of the upper electrode 221 of the MIM-type capacitor is sufficient for the additional etching of 150 Å, the plug HLD is not penetrated.

In addition, the etching of 3000 to 4000 Å and the additional etching of 150 Å may be implemented by one etching process of 3150 to 4150 Å or by etching processes different from each other. Furthermore, the additional etching of 150 Å is not necessarily performed, and it may be configured such that, for example, the film thickness from the lower end of the hole to the plug HLC is measured after the etching of 3000 to 4000 Å, and the additional etching is performed only in a case where the measured film thickness is equal to or more than 2050 Å.

According to the embodiment described above, as shown in FIG. 1, the optical sensor includes an impurity region for the photodiode and the angle limiting filter 40. The impurity region 30 for the photodiode is formed on the semiconductor substrate 10. The angle limiting filter 40 limits the incidence angle of light incident to the light receiving area of the photodiode. As shown in FIG. 5, the angle limiting filter 40 is formed by at least a first plug (HLC) corresponding to a first insulating layer (SLC) and a second plug (HLD) corresponding to a second insulating layer (SLD). In a case where the wavelength of the incidence light is denoted by λ, between the first plug (HLC) and the second plug (HLD), there is a gap area having a gap space of $\lambda/2$ or less.

Accordingly, even in a case where there is a gap area on the side wall, the incidence angle can be limited with high precision. In addition, by arranging the gap area, the process of forming the angle limiting filter can be simplified. In other words, in order to connect the plug HLD to the plug HLC located in the lower layer as above described with reference to FIG. 4, it is necessary to divide the mask of the plug HLD into parts for the angle limiting filter 40 and the peripheral circuit 200. From this point, according to this embodiment, the angle limiting filter 40 can be formed through a general wiring forming process without dividing the mask as described above with reference to FIG. 5. In the case of $b \leq \lambda/2$ to be described with reference to FIG. 7 and the like, light does not pass through the gap area, and accordingly, the angle limitation that is the same as that in the case of b=0 can be realized.

Here, the gap area is an area (a portion in which a light shielding material is not present) passing through an opening of the angle limiting filter and a side wall that shields another opening adjacent to the opening. The gap area may be continuous so as to turn around the outer periphery of the side wall or may be a hole that is intermittently open. In addition, the gap area may be one or a plurality of holes that are empty in the side wall.

Here, the gap space b is a distance from one wall to the other wall. For example, the gap area between the plug HLD and the plug HLC is a continuous gap space that turns around the outer periphery of the side wall and is in parallel with the semiconductor substrate 10. In such a case, a distance from the lower end of the plug HLD that is a gap area upper wall to the plug HLC that is a gap area lower wall is the gap space b. In addition, for example, in a case where the gap space is a rectangular hole, a distance between the longer sides of the rectangle is the gap space b.

In addition, in this embodiment, the first insulating layer (SLC) is an insulating layer that is disposed between the first metal layer (ALC) and the second metal layer (ALD) that is located in a layer above that of the first metal layer (ALC). In addition, the second insulating layer (SLD) is an insulating layer that is disposed between the second metal layer (ALD) and the third metal layer (ALE) that is located on the upper layer of the second metal layer (ALD). The second metal layer (ALD) is a metal layer having a thickness (5000 to 6000 Å) larger than the thickness (for example, 3000 to 4000 Å) of the first metal layer (ALC). In other words, regarding the thickness of the metal layer stacked through the semiconductor process, the thickness of the second metal layer is larger than that of the first metal layer.

As described above with reference to FIG. 4, since the aluminum layer ALD is thicker than the aluminum layer ALC, a gap area is generated between the plug HLD and the plug HLC. According to this embodiment, by controlling the gap area to be $b \leq \lambda/2$, the leaking light is suppressed, whereby a desired limiting angle can be acquired.

In addition, the optical sensor according to this embodiment, as shown in FIG. 1, includes a processing circuit (peripheral circuit 200) that processes an output signal of the photodiode 30. As illustrated in FIG. 5, the wiring of the processing circuit is formed at least by the first to third metal layers (ALC to ALE) and the first and second plugs (HLC and HLD). In addition, the first plug (HLC) and the second plug (HLD) that form the angle limiting filter 40 are formed through a process of forming a wiring layer of the processing circuit. For example, the angle limiting filter 40 is formed by insulating film formation through deposition of $SiO_2$, plug formation through deposition of tungsten, and the like.

Accordingly, the angle limiting filter 40 and the wiring layer of the processing circuit can be formed through the same (simultaneous) wiring forming process. Therefore, the process of forming the angle limiting filter 40 does not need to be separately prepared, whereby the process can be simplified. In addition, since the processing circuit can be integrated on the same chip of the photodiode 30 or the angle limiting filter 40, the size of the optical sensor can be decreased.

In addition, in this embodiment, as shown in FIG. 1, the processing circuit includes an MIM-type capacitor 220. As shown in FIG. 5, the MIM-type capacitor is formed in the second insulating layer (SLD) corresponding to the second plug (HLD). In particular, the capacitor having the MIM structure is a capacitor in which a second metal layer (ALD) is configured as the lower electrode, and a metal layer formed between the second metal layer (ALD) and the third metal layer (ALE) is configured as an upper electrode 221.

As described above with reference to FIG. 5, in order to fill in the gap area generated between the plug HLD and the plug HLC through etching, the plug HLD penetrates the upper electrode 221 of the MIM-type capacitor. According to this embodiment, by controlling the gap area to be $b \leq \lambda/2$, the problem of the penetration can be resolved.

Here, the processing circuit is formed by circuit elements such as a transistor, a capacitor, and a resistor, and the capacitor is formed by a capacitor having the MIM structure. For example, the processing circuit includes an operational amplifier, and a capacitor of the operational amplifier that is used for compensating for the phase is formed by the capacitor having the MIM structure.

As above, although a case where the optical sensor according to this embodiment is a spectroscopic sensor has been described, this embodiment is not limited thereto. For example, it may be configured such that the optical band pass filter 60 is omitted, and the optical sensor according to this embodiment is applied to an illuminance sensor or an elevation angle sensor.

Here, the illuminance sensor is an optical sensor that measures the intensity of illuminance (lux or lumen/square meter) of natural light or illuminance light. In this embodiment, since the incidence angle is limited by the angle limiting filter, the incidence of unwanted light from objects other than the measurement target can be limited. For example, it may be considered to apply this embodiment to a system that automatically turns on or off a headlight of a vehicle in accordance with the brightness level in the traveling direction. For example, when the vehicle enters a tunnel, the system does not respond to unwanted light, and accordingly, appropriate automatic turning on/off of the head light can be performed.

In addition, the elevation sensor is an optical sensor that measures the elevation angle that is an angle formed by the direction of the sun or an illuminance light source and a reference plane. The reference plane, for example, is a horizontal plane. In this embodiment, since the incidence angle is limited by the angle limiting filter, the elevation angle can be measured. For example, it may be considered to apply this embodiment to a photovoltaic power generation system. In such a case, the direction of the sun is measured with high precision, and, by facing a solar cell panel toward the direction, electricity can be generated with high efficiency.

3. Relationship Between Gap Space and Limitation Angle

In a case where the gap space satisfies the condition of $b \leq \lambda/2$ as described above, the leakage of light does not occur from the side wall of the angle limiting filter, and accordingly, a limitation angle that is similar to that of a case where there is no gap area can be acquired. This point will be described with reference to FIGS. 6 to 8.

Figure 6:
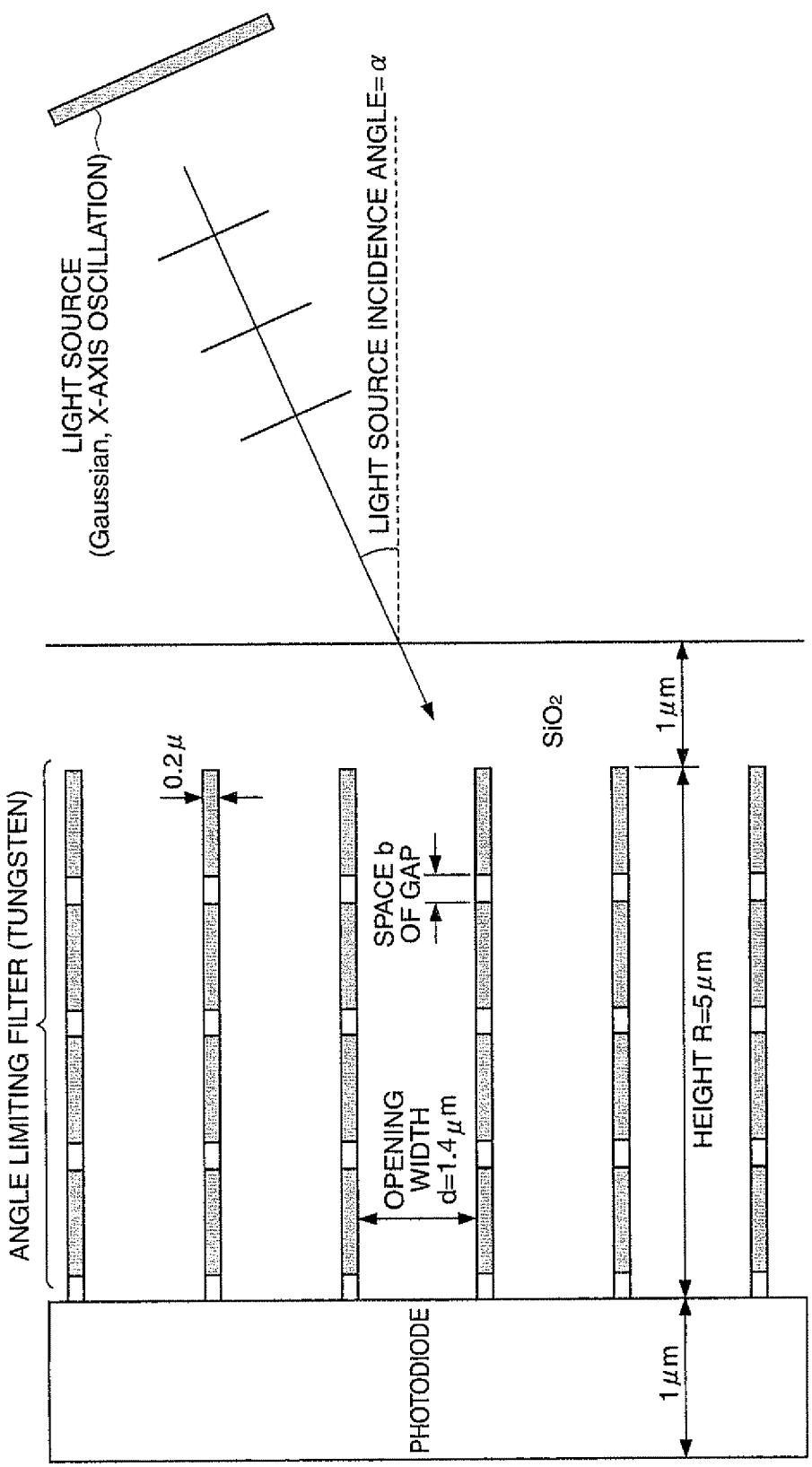
FIG. 6 is a schematic diagram showing simulation conditions.

First, a result of simulations of the limitation angle when the space b is changed will be described. FIG. 6 illustrates the simulation conditions. As illustrated in FIG. 6, the opening width d of the angle limiting filter is 1.4 μm, the height R thereof is 5 μm, and the thickness of the side wall is 0.2 μm. In such a case, the limitation angle $\theta = \tan^{-1}(d/R) = 15.6°$. It is assumed that the opening of the angle limiting filter is filled up with an $SiO_2$ oxide film. The space of the gap of the side wall is denoted by b, and an incidence angle of incidence light emitted from the light source is denoted by α. The wavelength λ of the incidence light emitted from the light source is 500 nm.

FIG. 7 illustrates a result of simulations of the characteristics of the light arrival ratio with respect to the incidence angle α under the above-described conditions. The light arrival ratio is a ratio of the amount of light arriving at the photodiode to the amount of light incident to the opening of the angle limiting filter. Hereinafter, the limitation angle θ is an incidence angle α when the light arrival ratio is 1/2 of the light arrival ratio of the case where the incidence angle α=0°. However, this embodiment is not limited thereto, and the limitation angle θ may be defined as an incidence angle of a case where the light arrival ratio is another ratio.

As represented as G1 in FIG. 7, in a case where the space b of the gap is 0 nm, the limitation angle θ=150. In addition, as represented as G2, in a case where the space b=250 nm, the limitation angle θ is 15°, which is the same as that of the case where b=0 nm. As above, for the space satisfying the condition of b≤λ/2=250 nm, there is no influence of the space on the limitation angle, and it can be understood that a limitation angle close to the desired limitation angle 15.60 can be acquired. On the other hand, as represented as G3, in a case where b=500 nm, and b>λ/2, the limitation angle θ=20°, and it is understood that the desired limitation angle cannot be acquired due to light leaking through the gap.

Next, the conditional equation of b≤λ/2 will be described based on the principle. As shown in FIG. 8A, in a case where light is propagated through a narrow space having an opening space b in the side wall of the angle limiting filter, light is propagated by being reflected on the wall face of the space. Light E+ that travels obliquely right upward from the entrance of the space is represented by the following Equation (3). In addition, light E⁻ that travels obliquely right downward from the entrance of the space is represented by the following Equation (4).

$$E^+ = \sin(kx \cdot \cos\beta + kx \cdot \sin\beta - \omega t) \quad (3)$$

$$E^- = \sin(-kx \cdot \cos\beta + kx \cdot \sin\beta - \omega t) \quad (4)$$

Here, β is an angle that is formed by a direction perpendicular to the wall face and the traveling direction of light. In addition, $k = 2\pi/\lambda$ is the frequency of light. The x axis is a coordinate axis along the direction perpendicular to the wall face, and the Z axis is a coordinate axis along a direction that is perpendicular to the x axis and is parallel to the wall face. In addition, ω is an angular frequency of light. Here, t represents time.

The light E inside the space, as represented by the following Equation (5), is represented by adding E⁺ and E⁻ together.

$$E = E^+ - E^- = 2\sin(kx \cdot \cos\beta) \cdot \cos(kx \cdot \sin\beta - \omega t) \quad (5)$$

On the wall face of a conductor, it is necessary to satisfy the boundary condition E=0. In a case where the wall face is set as x=0 or b, E=0 at x=0, which satisfies the boundary condition. In a case where x=b, the boundary condition is satisfied in the case of $\sin(kx \cdot \cos\beta) = 0$, and accordingly, only the angle β represented in the following Equation (6) is allowed. Here, n is a natural number.

$$kd \cdot \cos\beta = (2\pi b/\lambda)\cos\beta = n\pi \quad (6)$$

When b=λ/2, the following Equation (7) is formed, and only β=0° is allowed. As represented in FIG. 8B, light cannot be propagated inside the space at β=0°, and accordingly, light does not leak from the gap formed in the side wall at b≤λ/2.

$$(2\pi b/\lambda) \cdot \cos\beta = (2\pi(\lambda/2)/\lambda) \cdot \cos\beta = \pi\cos\beta = n\pi \quad (7)$$

According to the above-described embodiment, the desired limitation angle can be acquired when the space of the gap b≤λ/2. As described above, by arranging such a gap, the process can be simplified.

4. Size of Opening

According to this embodiment, by appropriately setting the width and the height of the opening of the angle limiting filter, the controllability of the angle and the light arrival ratio can be improved. This point will be described in detail.

As shown in FIG. 1, the width of the opening of the angle limiting filter 40 is denoted by d [μm] and the height of the opening is denoted by R [μm]. In addition, the wavelength of the incidence light with respect to the angle limiting filter 40 is denoted by λ [μm]. In such a case, the angle limiting filter 40 is formed so as to satisfy the condition represented in the following Equation (8).

$$d^2/(\lambda \times R) \geq 2 \quad (8)$$

In addition, the angle limiting filter 40 is formed such that the limitation angle θ satisfies the condition represented in the following Equation (9). The reason for this is that, even in a case where there is no angle limiting filter 40, when the incidence angle of the incidence light is 60°, the amount of light arriving at the photodiode 30 is 1/2 of the amount of the incidence light. In other words, in a case where the incidence angle at which the amount of arrived light is 1/2 of the incidence angle is set as the limitation angle, in order to allow the angle limitation of the angle limiting filter 40 to be effective, it is necessary that 0<60°.

$$60° > \theta = \tan^{-1}(d/R) \quad (9)$$

Next, in contrast to Equation (8) described above, an angle limiting filter satisfying the condition of $d^2/(\lambda \times R) < 2$ will be described as a comparative example. FIGS. 9A to 9C represent measured values of the angle characteristics of the comparative example. FIGS. 9A to 9C show measured values when the wavelength λ=0.5 μm, and the height R=5 μm.

FIG. 9A shows the characteristic of the light arrival ratio when the light arrival ratio at an incidence angle of 0° is 1 in a case where there is no angle limiting filter. The light arrival ratio is a ratio of the amount of light arriving at the photodiode to the amount of light incident to the opening of the angle limiting filter.

As represented as A1 in FIG. 9A, in a case where there is no angle limiting filter, the light arrival ratio gently decreases in accordance with an increase in the incidence angle. As represented as A2, in a case where the limitation angle θ=150, and the opening width d=1.34 μm, the maximum value of the light arrival ratio is 0.23. In addition, as represented as A3, in a case where the limitation angle θ=20°, and the opening width d=1.82 μm, the maximum value of the light arrival ratio is 0.45. As above, the angle limiting filter of the comparative example cuts the angle at which the light arrival ratio is 50%, and accordingly, in a case where incidence light is dark, there is a possibility that the sensitivity is insufficient.

FIG. 9B shows a light arrival ratio characteristic acquired by normalizing the light arrival ratio characteristic shown in FIG. 9A to the incidence angle 0° as "1". In FIG. 2B, measured values in a case where there is no angle limiting filter are represented as B1, measured values in a case where θ=15° are represented as B2, and measured values in a case where θ=20° are represented as B3. As illustrated in B2 and B3, all the limitation angles that are actually measured are about 22°, and the desired angle controllability is not acquired.

In FIG. 9C, the above-described measured values are arranged. As shown in FIG. 9C, $d^2/(\lambda \times R)<2$ in any case of θ=15° and θ=20°, and it can be understood that the angle controllability and the light arrival ratio cannot be sufficiently acquired in this range.

From this point, according to this embodiment, as represented in Equation (8) described above, by forming the angle limiting filter such that $d^2/(\lambda \times R) \geq 2$ is satisfied, the angle controllability and the light arrival ratio can be improved. A detailed description will be followed with reference to FIGS. 10A to 10C. In FIGS. 10A to 10C, measured values at a wavelength λ=0.5 μm and a height R=5 μm are represented.

In FIG. 10A, the light arrival ratio characteristic when the light arrival ratio at an incidence angle of 0° is "1" in a case where there is no angle limiting filter is represented. As represented as C1 shown in FIG. 10A, the characteristic of the case where there is no angle limiting filter is not different from that of the comparative example. As represented as C2, in a case where the limitation angle θ=25° and the opening width d=2.33 μm, a maximum value of the light arrival ratio is 0.54. In addition, as represented as C3, in a case where the limitation angle θ=30° and the opening width d=2.89 μm, a maximum value of the light arrival ratio is 0.64. As above, according to this embodiment, the light arrival ratio is higher than 50%.

In FIG. 10B, a light arrival ratio characteristic acquired by normalizing the light arrival ratio characteristic, which is shown in FIG. 10A, to an incidence angle of 0° as "1" is illustrated. As represented as D1 shown in FIG. 10B, measured values of the case where there is no angle limiting filter are illustrated, as represented as D2, measured values in a case where θ=250 are illustrated, and as represented as D3, measured values in a case where θ=30° are illustrated. As represented as D2 and D3, the limitation angles that are actually measured are 24° to 25° and 28° to 29°, and accordingly, desired angle controllability can be acquired.

In FIG. 10C, the above-described measured values are arranged. As shown in FIG. 10C, the condition of $d^2/(\lambda \times R) \geq 2$ is satisfied in any case of θ=250 and θ=30°, and it can be understood that the angle controllability and the light arrival ratio are sufficiently acquired in this range. As above, as the angle controllability is improved, for example, in a spectroscopic sensor, desired wavelength resolution can be realized. In addition, since the light arrival ratio is higher than that of the comparative example, high-sensitivity sensing can be performed even in a case where the amount of light is small.

For example, when the angle limiting filter with θ=15° of the above-described comparative example is designed in the range of $d^2/(\lambda \times R) \geq 2$, as represented in the following Equation (10), it may be configured such that d=4.02 mm and R=15 μm. In addition, in the angle limiting filter with θ=20°, as represented in the following Equation (11), it may be configured such that d=3.64 μm and R=10 μm.

$$d^2/(\lambda \times R) = 4.02^2/(0.5 \times 15) = 2.15 \geq 2 \quad (10)$$

$$d^2/(\lambda \times R) = 3.64^2/(0.5 \times 10) = 2.65 \geq 2 \quad (11)$$

According to the above-described embodiment, in a case where the height of the angle limiting filter is R, and the width of the opening of the angle limiting filter is d, a condition of $d^2/\lambda R \geq 2$ is satisfied.

Accordingly, control of the incidence limiting angle θ of incidence light with high precision and the improvement of the light arrival ratio can be achieved. In other words, compared to the measured values measured under the condition of $d^2/\lambda R < 2$ represented in FIG. 9C, in the measured values measured under the condition of $d^2/\lambda R \geq 2$ represented in FIG. 10C, the desired limitation angle is achieved, whereby the light arrival ratio is increased.

Here, the limitation angle θ is an angle θ at which a ratio of the amount of light arriving at the light receiving face in a case where incidence light is incident to the angle limiting filter 40 at an incidence angle of 0° to the amount of light arriving at the light receiving face in a case where incidence light is incident to the angle limiting filter 40 at an incidence angle of 0° is a predetermined attenuation ratio. For example, the predetermined attenuation ration is 1/2.

Here, the height R of the angle limiting filter 40 is a height in a direction perpendicular to the plane of the semiconductor substrate 10 and, for example, a height from the lower end to the upper end of a light shielding material that forms the angle limiting filter 40.

In addition, the opening of the angle limiting filter 40 is an area located on the side to which incidence light is incident in which a light shielding material is not present and is an area in which the incidence light is incident to the angle limiting filter 40. Furthermore, the outer circumference of the opening does not necessarily need to be closed by the light shielding material, and the light shielding material may be intermittently arranged along the outer circumference of the opening.

In addition, the opening width d of the opening is a length that defines the limitation angle θ (an aspect ratio of the opening width d to the height R) and, for example, in the case of a square-shaped opening, is the length of one side of the square. Furthermore, in the case of a rectangle-shaped opening, the opening width is the length of a longer side of the rectangle, in the case of a circle-shaped opening, the opening width is the diameter of the circle, and, in the case of an oval-shaped opening, the opening width is the length of the major axis of the oval.

5. Spectroscopic Sensor

Hereinafter, a detailed configuration example of the spectroscopic sensor according to the above-described embodiment will be described.

Figure 11:
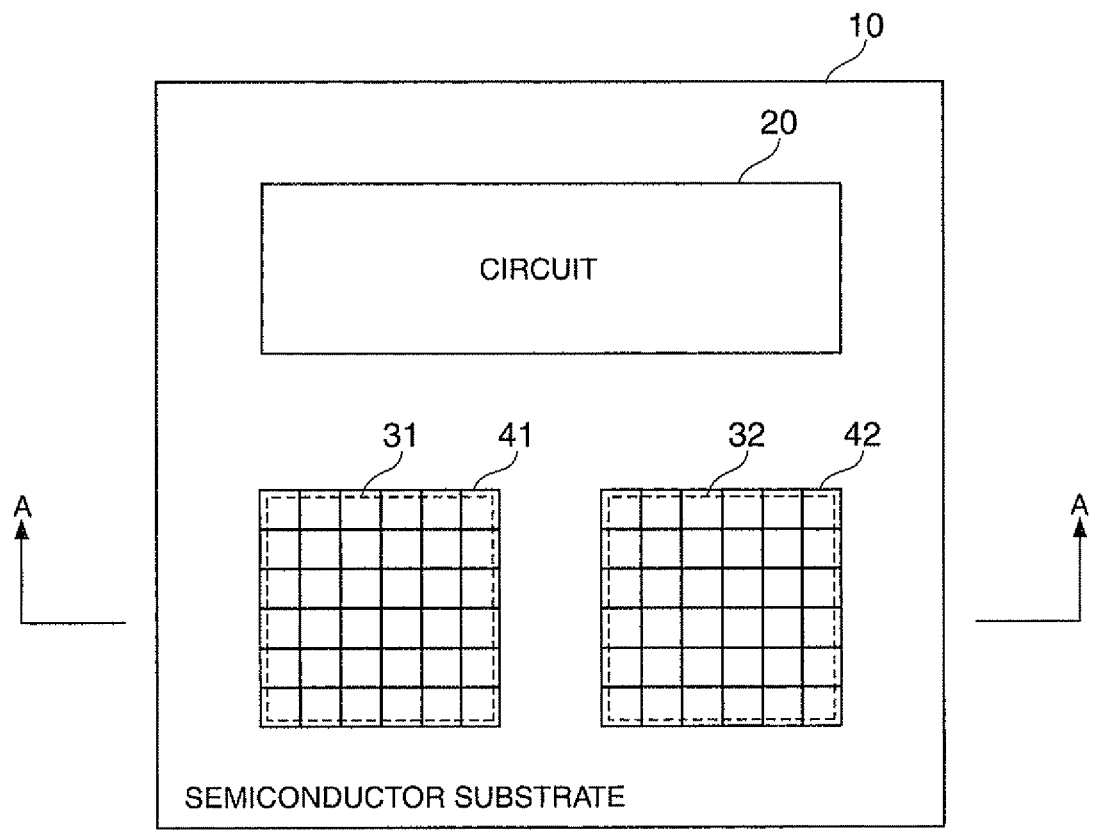
FIG. 11 is a plan view of a configuration example of a spectroscopic sensor.

FIG. 11 shows a plan view of a semiconductor substrate 10 in which the spectroscopic sensor is formed. FIG. 11 is a plan view viewed from the front face side on which a circuit 20, an angle limiting filter 41, and the like are formed in a plan view of the semiconductor substrate 10 viewed in a direction perpendicular to the plane thereof. As will be described later, while a multi-layer film filter is formed on the angle limiting filters 41 and 42, for simplification, the illustration thereof is omitted in FIG. 11.

The spectroscopic sensor shown in FIG. 11 includes: a semiconductor substrate 10; a circuit 20; a first photodiode 31 (in a broader sense, a first photosensor or an impurity region for a first photodiode); a second photodiode 32 (in a broad sense, a second photosensor or an impurity region for a second photodiode); a first angle limiting filter 41; and a second angle limiting filter 42.

The semiconductor substrate 10, for example, is configured by a P-type or N-type silicon substrate (silicon wafer). On the semiconductor substrate 10, the circuit 20, the photodiodes 31 and 32, and the angle limiting filters 41 and 42 are formed through a semiconductor process.

The angle limiting filters 41 and 42, for example, are formed in a lattice pattern in the plan view and limits the incidence angle of incidence light for the photodiodes 31 and 32. The circuit 20, for example, is configured by an amplifier that processes, for example, output signals of the photodiodes 31 and 32, an A/D conversion circuit, and the like.

In addition, the spectroscopic sensor according to this embodiment is not limited to have the configuration shown in FIG. 11, and various changes can be made such as omission of some (the circuit 20) of the constituent elements thereof or addition of another constituent element. For example, two photodiodes and two angle limiting filters may be arranged as described above, or one or a plurality thereof may be formed. In addition, the angle limiting filters 41 and 42 may have a lattice pattern in the plan view as described above or may have another shape.

Figure 12:
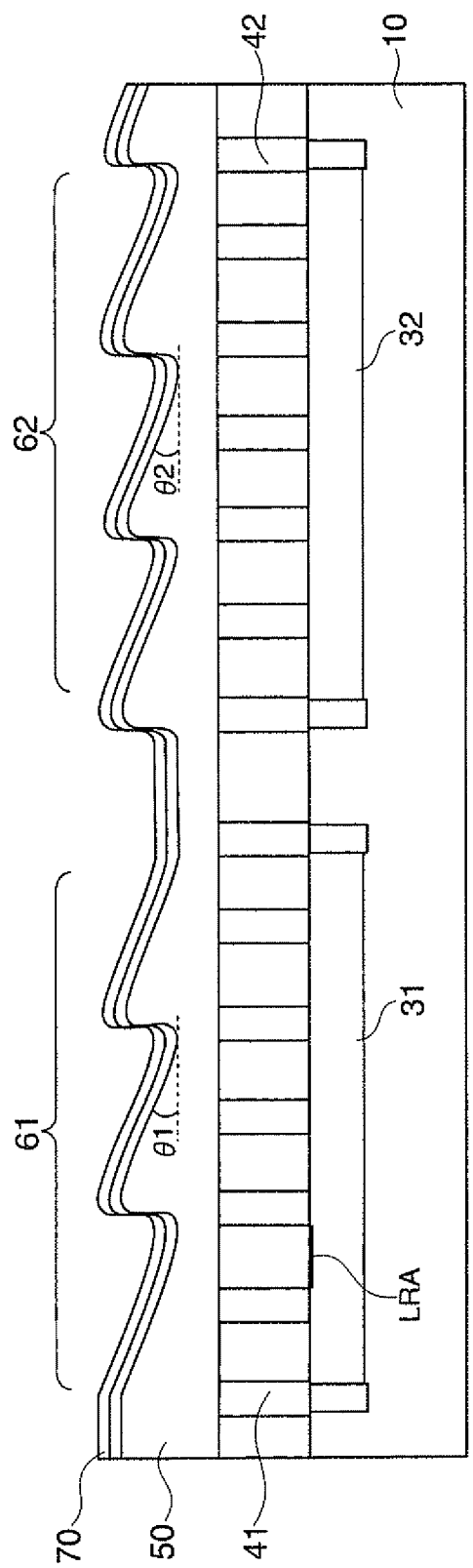
FIG. 12 is a cross-sectional view of the configuration example of the spectroscopic sensor.

FIG. 12 a cross-sectional view of the spectroscopic sensor. FIG. 12 is a cross-sectional view taken along line A-A shown in FIG. 11. The spectroscopic sensor shown in FIG. 12 includes: the semiconductor substrate 10; the photodiodes 31 and 32; the angle limiting filters 41 and 42; a tilted structure body 50 (angle structure body); a first optical band pass filter 61 (a first multi-layer film filter or a first dielectric filter); and a second optical band pass filter 62 (a second multi-layer film filter or a second dielectric filter).

The photodiodes 31 and 32 are formed on the semiconductor substrate 10. As will be described later, these photodiodes 31 and 32 are formed by forming impurity regions through ion injection or the like. For example, the photodiodes 31 and 32 are implemented through a PN junction of an N-type impurity region formed on a P substrate and the P substrate. Alternatively, the photodiodes 31 and 32 are implemented through a PN junction of a P-type impurity region formed on a deep N well (N-type impurity region) and the deep N well.

The angle limiting filters 41 and 42 are formed by using a light shielding material (for example, a light absorbing material or a light reflecting material) that has a light shielding property for a wavelength detected by the photodiodes 31 and 32. In particular, the angle limiting filters 41 and 42 are formed through a wiring forming process included in the semiconductor process and are formed by conductive plugs such as tungsten plugs (in a broad sense, plugs made from a light absorbing material). In addition, the angle limiting filters 41 and 42 may be formed so as to include conductive layers such as aluminum wiring layers (in a broad sense, wiring layers formed from a light reflecting material).

The aspect ratio that is the ratio of the opening width to the height of the lower side of the angle limiting filters 41 and 42 is set in accordance with the transmission wavelength band (for example, BW1 and BW2 to be described later with reference to FIG. 13B) of the optical band pass filters 61 and 62. The opening portions (hollow portions) of the angle limiting filters 41 and 42 are formed by using a material that is transparent for the wavelength detected by the photodiodes 31 and 32 and are formed (filled) by insulating layers such as $SiO_2$ films (silicon oxide films).

The tilted structure body 50 is formed on the angle limiting filters 41 and 42 and have tilted faces having mutually different tilt angles in accordance with the transmission wavelengths of the optical band pass filters 61 and 62. In particular, a plurality of tilted faces of a tilt angle $\theta 1$ with respect to the plane of the semiconductor substrate 10 is formed on the photodiode 31, and a plurality of tilted faces of a tilt angle $\theta 2$, which is different from $\theta 1$, is formed on the photodiode 32. As will be described later, the tilted structure body 50 is formed by processing an insulating film such as a film formed from $SiO_2$ through etching, CMP, a gray scale photolithographic printing technique, or the like.

The optical band pass filters 61 and 62 are formed by a multi-layer thin film 70 that is stacked on the tilted structure body 50. The transmission wavelength bands of the optical band pass filters 61 and 62 are determined based on the tilt angles $\theta 1$ and $\theta 2$ of the tilted structure body 50 and the incidence light limitation angles (aspect ratio) of the angle limiting filters 41 and 42. For the configurations in which the transmission wavelength is changed in accordance with the tilt angle, the optical band pass filters 61 and 62 are staked not through processes separated for each transmission wavelength but through the same multi-layer film forming process.

However, in a general optical sensor, there is a problem in that it is difficult to decrease the size. For example, in a spectroscopic sensor that acquires a continuous spectrum, a prism and the like used for generating the continuous spectrum need to be arranged, or an optical path length needs to be acquired, the size of the device is increased. Accordingly, it is difficult to dispose a plurality of the sensors, constantly dispose the sensor in a test target object, and the like.

From this point, the optical sensor according to this embodiment includes impurity regions 31 and 32 for photodiodes and the angle limiting filter 40. The impurity regions 31 and 32 for photodiodes are formed on a semiconductor substrate 10. The angle limiting filters 41 and 42 are formed from a light shielding material formed through the semiconductor process on the impurity regions 31 and 32 for photodiodes.

Accordingly, each constituent element of the optical sensor can be configured through the semiconductor process, and accordingly, the size of the optical sensor can be decreased. In other words, by forming the photodiodes 31 and 32 and the angle limiting filters 41 and 42 through the semiconductor process, fine processing can be performed in an easy manner, and the size can be decreased. In addition, compared to a case where members are configured by being bonded together, the selectivity of the transmission wavelength can be improved. In addition, compared to a case where an optical fiber is used as the angle limiting filter, a decrease in transmitted light due to a decrease in the limitation angle (the number of openings) is suppressed, whereby the selectivity of the wavelength can be improved.

Here, the semiconductor process is a process in which a transistor, a resistor, a capacitor, an insulating layer, a wiring layer, and the like are formed on a semiconductor substrate. For example, the semiconductor process is a process that includes a impurity introducing process, a thin-film forming process, a photolithographic process, an etching process, a planarization process, and a thermal process.

In addition, the light receiving areas of the photodiodes are areas located on the impurity regions 31 and 32 for photodiodes to which incidence light passing through the angle limiting filters 41 and 42 is incident. For example, in FIG. 11, the light receiving areas are areas corresponding to the openings of the angle limiting filters 41 and 42 having the lattice shape. Alternatively, in FIG. 12, the light receiving area is an area (for example, an area LRA) that is surrounded by a light shielding material that forms the angle limiting filters 41 and 42.

Furthermore, the light shielding material is a light absorbing material or a light reflecting material. The light absorbing material, for example, is tungsten, and the light reflecting material, for example, is aluminum.

In addition, the angle limiting filters 41 and 42 are not limited to be closed along the outer circumference of the light receiving area but may have a non-continuous area along the outer circumference or be arranged intermittently along the outer circumference.

Figure 14:
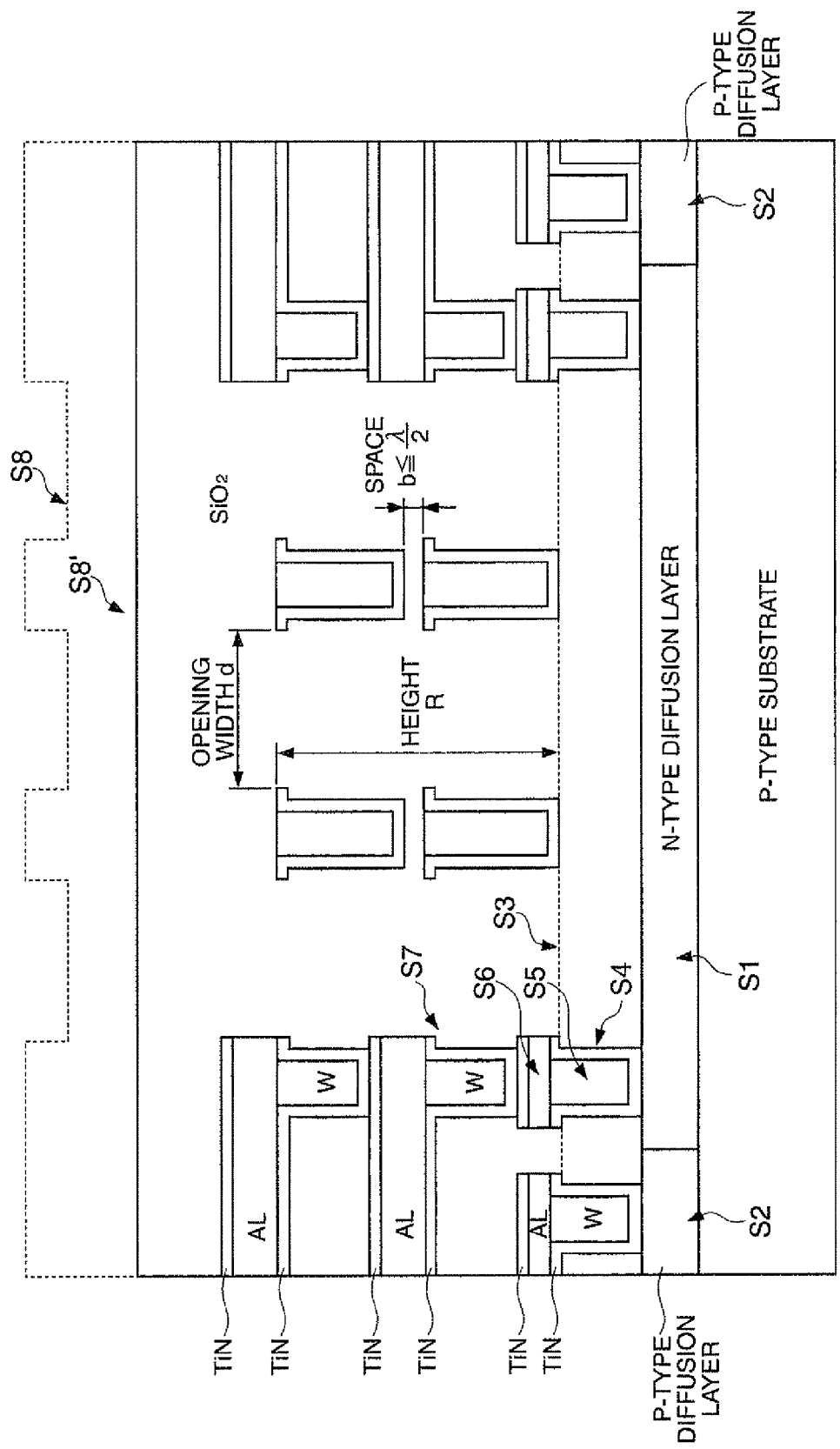
FIG. 14 shows an example of a method of manufacturing an optical sensor.

Furthermore, in this embodiment, as shown in FIG. 14 to be described later, the angle limiting filters 41 and 42 are formed by conductive plugs of contact holes that are formed to be vacated in the insulating film stacked on the semiconductor substrate 10. In other words, the angle limiting filters 41 and 42 are formed only by conductive plugs such as tungsten plugs formed in an insulating film, which is formed from $SiO_2$ or the like, without using a metal wiring layer such as an aluminum wiring.

Accordingly, the angle limiting filters 41 and 42 can be formed by the conductive plugs. In particular, since the angle limiting filters 41 and 42 can be formed by tungsten plugs formed from a light absorbing material, the light shielding property can be improved.

Here, the contact hole is a contact hole vacated for a contact that is conductive between the wiring layer and the semiconductor substrate or a contact hole vacated for a via contact that is conductive between a wiring layer and another wiring layer.

In addition, the angle limiting filters 41 and 42 are not limited to aluminum wiring layers formed from a light reflecting material or tungsten contacts formed from a light absorbing material but may be a wiring layer formed from a light absorbing material or a contact formed from a light reflecting material. However, in a case where the angle limiting filters 41 and 42 are formed from a light absorbing material, the light shielding property is improved.

Furthermore, the angle limiting filters 41 and 42 may be formed from an aluminum wiring layer or a tungsten contact to which a film formed from titanium nitride (TiN) or the like as a light absorbing material is added. Since the aluminum wiring layer is changed to absorb light, and the light absorbing property of titanium nitride (TiN) is higher than that of tungsten, the light absorbing property of the contact is improved. Accordingly, the light shielding property can be improved further.

In addition, in this embodiment, the angle limiting filters 41 and 42 may be formed from a conductive layer or a conductive plug formed through a semiconductor process and be electrodes to acquire signals from the impurity regions for photodiodes 31 and 32. For example, in a case where the impurity regions for the photodiodes 31 and 32 are P-type impurity regions, the angle limiting filters 41 and 42 that are conductive to the P-type impurity regions may also serve as anode electrodes of the photodiodes 31 and 32.

In such a case, the angle limiting filters 41 and 42 formed from a conductive layer or a conductive plug may be used as the electrodes of the photodiodes 31 and 32. Accordingly, electrodes do not need to be arranged in addition to the angle limiting filters 41 and 42, whereby a decrease in the amount of incidence light due to the electrodes can be avoided.

Furthermore, the optical sensor according to this embodiment includes the optical band pass filters 61 and 62 that transmit light of a specific wavelength out of incidence light. For example, in this embodiment, the semiconductor substrate 10, the angle limiting filters 41 and 42, and the optical band pass filters 61 and 62 are sequentially stacked in the mentioned order through semiconductor process.

Accordingly, light of a specific wavelength out of the incidence light can be allowed to be incident to the angle limiting filters 41 and 42 or the impurity regions for the photodiodes 31 and 32. In addition, as will be described with reference to FIG. 13A and the like, although the transmission wavelength of the optical band pass filters 61 and 62 changes in accordance with the incidence angle, the transmission wavelength band can be limited by the angle limiting filters 41 and 42.

In addition, in this embodiment, the optical band pass filter 61 and 62 are formed by multi-layer thin films that are tilted at angles $\theta 1$ and $\theta 2$ corresponding to the transmission wavelengths with respect to the semiconductor substrate 10. In particular, the optical band pass filters 61 and 62 are formed by a plurality of sets of multi-layer thin films having mutually different transmission wavelengths. The plurality of sets of multi-layer thin films has tilt angles $\theta 1$ and $\theta 2$ with respect to the semiconductor substrate 10 that are different in correspondence with the transmission wavelengths and is formed through a simultaneous thin-film forming process. For example, as illustrated in FIG. 12, one set of multi-layer thin films is formed by continuously arranging a plurality of multi-layer thin films having a tilt angle of $\theta 1$. Alternatively, in a case where multi-layer thin films of mutually different tilt angles $\theta 1$ to $\theta 3$ are arranged so as to be adjacent to each other, and the multi-layer thin films of tilt angles $\theta 1$ to $\theta 3$ are repeatedly arranged, one set of multi-layer thin films may be formed by a plurality of multi-layer thin films of the same tilt angle.

In such a case, the optical band pass filters 61 and 62 can be formed by the multi-layer thin-films titled at angles $\theta 1$ and $\theta 2$ corresponding to the transmission wavelengths. Accordingly, the multi-layer thin films of thicknesses corresponding to the transmission wavelengths do not need to be stacked in separate processes for the transmission wavelengths, whereby the process of forming the multi-layer thin films can be simplified.

Here, the simultaneous thin-film forming process represents not a process in which the same process in which, after a first set of multi-layer thin films is formed, a second set of multi-layer thin films is formed is sequentially repeated but a process in which a plurality of sets of multi-layer thin films is formed through the same (one) thin film forming process.

In addition, in this embodiment, the tilted structure body 50 that is disposed on the angle limiting filters 41 and 42 is included. The tilted structure body 50 includes tilted faces that are tilted at angles $\theta 1$ and $\theta 2$ corresponding to the transmission wavelengths of the optical band pass filters 61 and 62 with respect to the semiconductor substrate 10, and multi-layer thin films are formed on the tilted faces.

Accordingly, by forming the multi-layer thin films on the tilted faces of the tilted structure body 50, the multi-layer thin films that are tilted at angles $\theta 1$ and $\theta 2$ corresponding to the transmission wavelengths of the optical band pass filters 61 and 62 can be formed.

In addition, in this embodiment, the tilted structure body 50 is formed on the angle limiting filters 41 and 42 through a semiconductor process. For example, as will be described with reference to FIG. 15 and the like, in the tilted structure body 50, a level different or a density pattern is formed in a transparent film (insulating film) stacked through a semiconductor process, and the tilted structure body 50 is formed by either etching or grinding (for example, CMP) the level difference or the density pattern.

Accordingly, the tilted structure body can be formed through the semiconductor process. Therefore, the process of forming the tilted structure body can be simplified. In addition, compared to a case where the tilted structure body is configured as a separate member, the cost can be reduced. Furthermore, a decrease in the amount of light on a contact face that is in contact with the tilted structure body as a separate member can be avoided.

Here, a level difference in the insulating film, for example, is a height difference from the front face of the semiconductor substrate to the surface of the insulating film on the end face of the semiconductor substrate. In addition, the density pattern of the insulating film, for example, is a pattern of heights from the front face of the semiconductor substrate to the surface of the insulating film on the end face of the semiconductor substrate, and the density pattern of the insulating film is formed based on the ratio between high portions and low portions.

In addition, the tilted structure body 50 is not limited to being formed through grinding or etching of the level difference or the density pattern but may be formed by using a gray scale photolithographic printing technique. According to the gray scale photolithographic printing technique, a resist is exposed by using a gray scale mask having a density pattern, and etching is performed by using the exposed resist, whereby the titled structure body is formed.

6. Transmission Wavelength Band of Optical Band Pass Filter

As described above, the transmission wavelength band of the optical band pass filter is set based on the tilt angle of the multi-layer thin film and the limitation angle of the angle limiting filter. This point will be described in detail with reference to FIGS. 13A and 13B. For simplification of the description, hereinafter, a case will be described as an example in which the film thicknesses of the multi-layer thin films of the optical band pass filters 61 and 62 are the same. However, in this embodiment, the film thicknesses of the multi-layer thin films of the optical band pass filters 61 and 62 may be different from each other in correspondence with the tilt angles $\theta 1$ and $\theta 2$. For example, in the deposition of thin films, in a case where the thin films are grown in a direction perpendicular to the semiconductor substrate, the film thicknesses of the multi-layer thin films of the optical band pass filters 61 and 62 may be configured to be in proportion to cos $\theta 1$ and cos $\theta 2$.

Figure 13A:
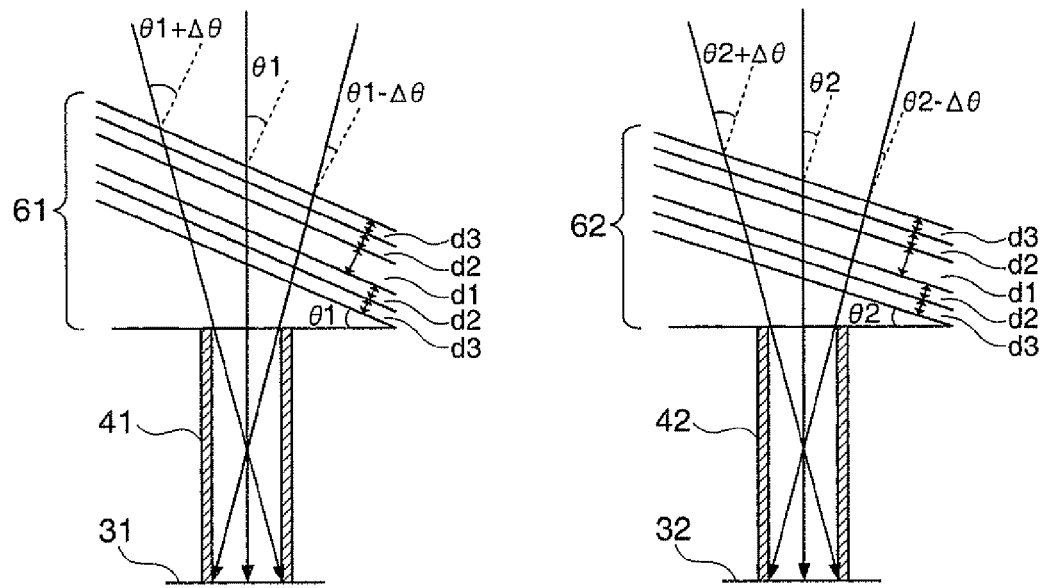
FIGS. 13A and 13B are schematic diagrams showing transmissive wavelength bands of an optical band pass filter.

As shown in FIG. 13A, the multi-layer thin films of the optical band pass filters 61 and 62 are formed as thin films having a thickness d1 to d3 (here, d2<d1 and d3<d1). On the upper and lower sides of the thin film having a thickness d1, a plurality of layers of thin films having thicknesses d2 and d3 is alternately stacked. The thin film of the thickness d2 is formed from a material that has a refractive index different from those of the thin films of thicknesses d1 and d3. In addition, in FIG. 13A, although the number of layers of thin films of thicknesses d2 and d3 is omitted for simplification, actually, thin films of several tens or several hundreds of layers are stacked on the upper and lower sides of the thin film of the thickness d1. Furthermore, in FIG. 13A, although one layer of the thin film of the thickness d1 is configured for simplification, actually, a plurality of layers is formed in many cases.

Since the multi-layer thin film of the optical band pass filter 61 has a tilt angle $\theta 1$ with respect to the light receiving face of the photodiode 31, a light beam perpendicular to the light receiving face is incident to the multi-layer thin film of the optical band pass filter 61 at the angle $\theta 1$. When the limitation angle of the angle limiting filter 41 is denoted by $\Delta\theta$, a light beam that is incident to the multi-layer thin film of the optical band pass filter 61 at an angle $\theta 1-\Delta\theta$ to $\theta 1+\Delta\theta$ arrives at the light receiving face of the photodiode 31. Similarly, a light beam that is incident to the multi-layer thin film of the optical band pass filter 62 at an angle $\theta_2-\Delta\theta$ to $\theta 2+\Delta\theta$ arrives at the light receiving face of the photodiode 32.

Figure 13B:
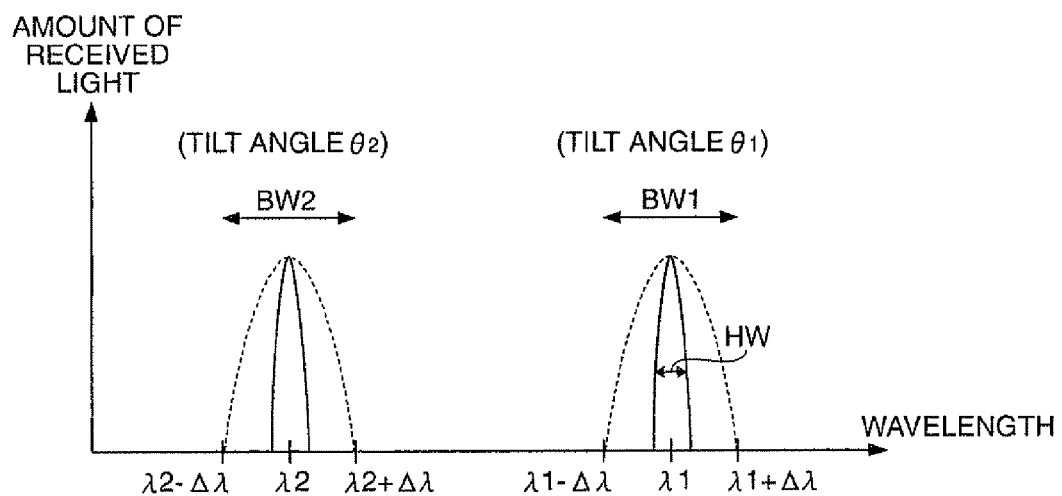

As shown in FIG. 13B, the transmission wavelength band BW1 of the optical band pass filter 61 is $\lambda 1-\Delta\lambda$ to $\lambda 1+\Delta\lambda$. In such a case, the transmission wavelength $\lambda 1$ for the light beam having an incidence angle $\theta 1$ is $2\times n\times d1\times \cos \theta 1$. Here, n is the refractive index of the thin film of the thickness d1. In addition, $\lambda 1-\Delta\lambda=2\times n\times d1\times\cos(\theta 1+\Delta\theta)$, and $\lambda 1+\Delta\lambda=2\times n\times d1\times\cos(\theta 1-\Delta\theta)$. A half-value width HW (for example, HW<BW1) of the transmission wavelength for the light beam having the incidence angle $\theta 1$ is determined based on the number of stacked layers of the multi-layer film. The amount of received light of the photodiode 31 is maximum at the incidence angle $\theta 1$ that is perpendicular to the light receiving face and is zero at the limitation angle. Accordingly, the amount of received light for the entire incidence light is represented by a curve denoted by a dotted line. Similarly, the transmission wavelength band BW2 of the optical band pass filter 62 is $\lambda 2-\Delta\lambda$ to $\lambda 2+\Delta\lambda$. For example, in a case where $\theta 2>\theta 1$, $\lambda 2=2\times n\times d1\times\cos \theta 2 < \lambda 1=2\times n\times d1\times\cos \theta 1$.

According to the above-described embodiment, the angle limiting filters 41 and 42 limit the ranges of changes in the transmission wavelengths to $\lambda 1-\Delta\lambda$ to $\lambda 1+\Delta\lambda$ and $\lambda 2-\Delta\lambda$ to $\lambda 2+\Delta\lambda$ by limiting the incidence angles of incident light to $\theta 1-\Delta\theta$ to $\theta 1+\Delta\theta$ and $\theta 2-\Delta\theta$ to $\theta 2+\Delta\theta$. In the optical band pass filter, the bands BW1 and BW2 of specific wavelengths for transmission are set based on the ranges of changes in the transmission wavelengths $\lambda 1-\Delta\lambda$ to $\lambda 1+\Delta\lambda$ and $\lambda 2-\Delta\lambda$ to $\lambda 2+\Delta\lambda$ that are limited by the angle limiting filters 41 and 42.

Accordingly, the transmission wavelength bands BW1 and BW2 of the optical band pass filter are limited by the angle limiting filters 41 and 42, whereby only light of a wavelength band as a measurement target can be sensed. For example, the limitation angle of the angle limiting filters 41 and 42 is set as $\Delta\theta\leq 30°$. More preferably, the limitation angle of the angle limiting filters 41 and 42 is set as $\Delta\theta\leq 20°$.

7. Manufacturing Method

Hereinafter, an example of a method of manufacturing a spectroscopic sensor according to this embodiment in a case where the tilted structure body is formed through a semiconductor process will be described with reference to FIGS. 14 to 16.

First, as illustrated in S1 shown in FIG. 14, an N-type diffusion layer (impurity region of the photodiode) is formed on a P-type substrate by a photolithographic process, an ion injection process, and a photoresist peel-off process. As illustrated in S2, P-type diffusion layers are formed on the P-type substrate through a photolithographic process, an ion injection process, a photoresist peel-off process, and a thermal process. The N-type diffusion layer becomes the cathode of the photodiode, and the P-type diffusion layer (P-type substrate) becomes the anode thereof.

Next, as illustrated in S3, an insulating film is formed through an $SiO_2$ deposition process and a planarization process through CMP. As illustrated in S4, contact holes are formed through a photolithographic process, an $SiO_2$ anisotropic dry etching process, and a photoresist peel-off process. Then, as illustrated in S5, the contact holes are buried through a TiN sputtering process, a W (tungsten) deposition process, and a W etching back process. Thereafter, as illustrated in S6, a first AL wiring is formed through an AL (aluminum) sputtering process, a TiN sputtering process, a photolithographic process, an AL and TiN anisotropic dry etching process, and a photoresist peel-off process.

Next, as illustrated in S7, a via contact and a second AL wiring are formed through the same process as S3 to S6 described above. Then, the process of S7 is repeated a number of times as is necessary. FIG. 14 shows a case where up to a third AL wiring is formed. In a via contact forming process in which the third AL wiring located in the uppermost layer and the second AL wiring located in the lower layer are connected to each other, in the $SiO_2$ anisotropic dry etching process, etching is performed such that a space between the lower end of the contact hole and the upper end of the via contact that is located in the lower layer is adjusted so as to satisfy the condition of $b \leq \lambda/2$. Next, as illustrated in S8, an insulating film is formed by performing an $SiO_2$ deposition process. As illustrated in S8', a planarization process through CMP is performed. Through the wiring forming process described above, the AL wiring and the tungsten plug that configure the angle limiting filter are stacked.

Figure 15:
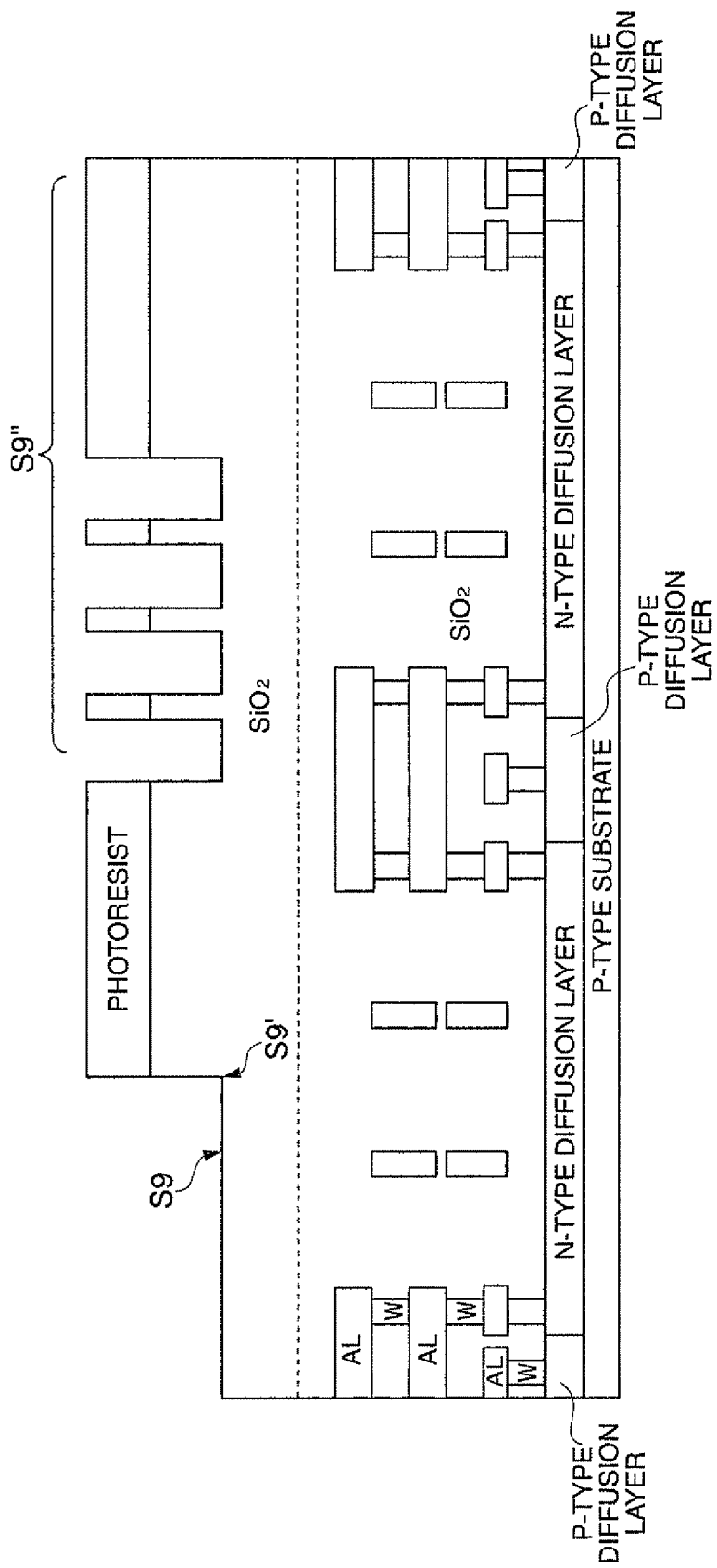
FIG. 15 shows an example of a method of manufacturing an optical sensor.

Next, as illustrated in S9 shown in FIG. 15, a level difference (S9') or a density pattern (S9") of the insulating film is formed through an $SiO_2$ deposition process, a photolithographic process, an $SiO_2$ anisotropic dry etching, and a photoresist peel-off process.

Figure 16:
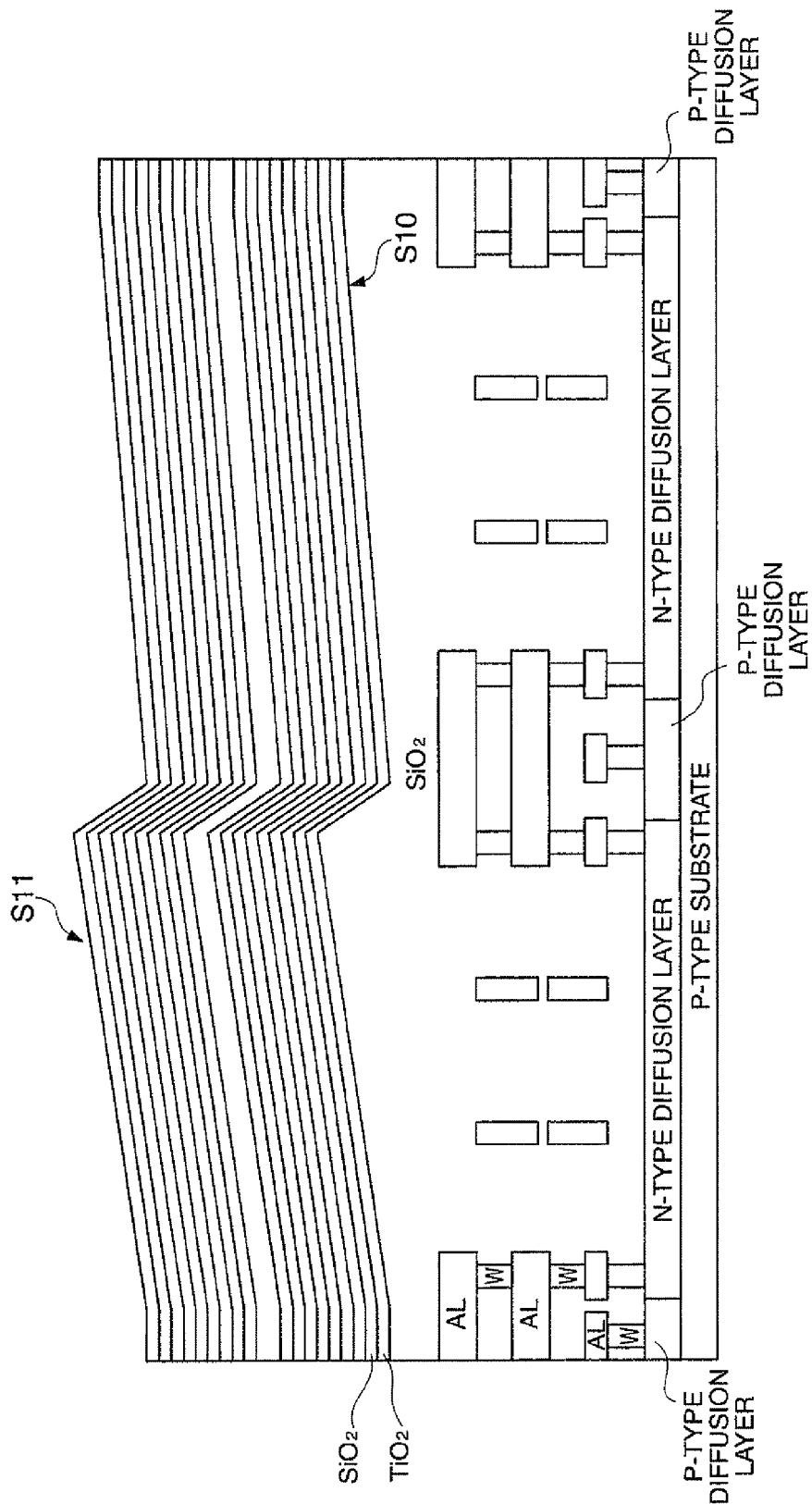
FIG. 16 shows an example of a method of manufacturing an optical sensor.

Next, as illustrated in S10 shown in FIG. 16, a tilted face of the tilted structure body is formed by performing a grinding process through CMP. At this time, the tilted face of the tilted structure body is processed at a tilt angle corresponding to the level difference or the density pattern of the insulating film.

Next, as illustrated in S11, a multi-layer thin film is formed on the tilted face by alternately performing a $TiO_2$ (titanium oxide film) sputtering process and an $SiO_2$ sputtering process. The $TiO_2$ film is a thin film having a high refractive index, and the $SiO_2$ film is a thin film having a low refractive index.

8. Modified Example of Manufacturing Method

A manufacturing method according to a first modified example in which the tilted structure body is formed as a separate member will be described with reference to FIG. 17.

Figure 17:
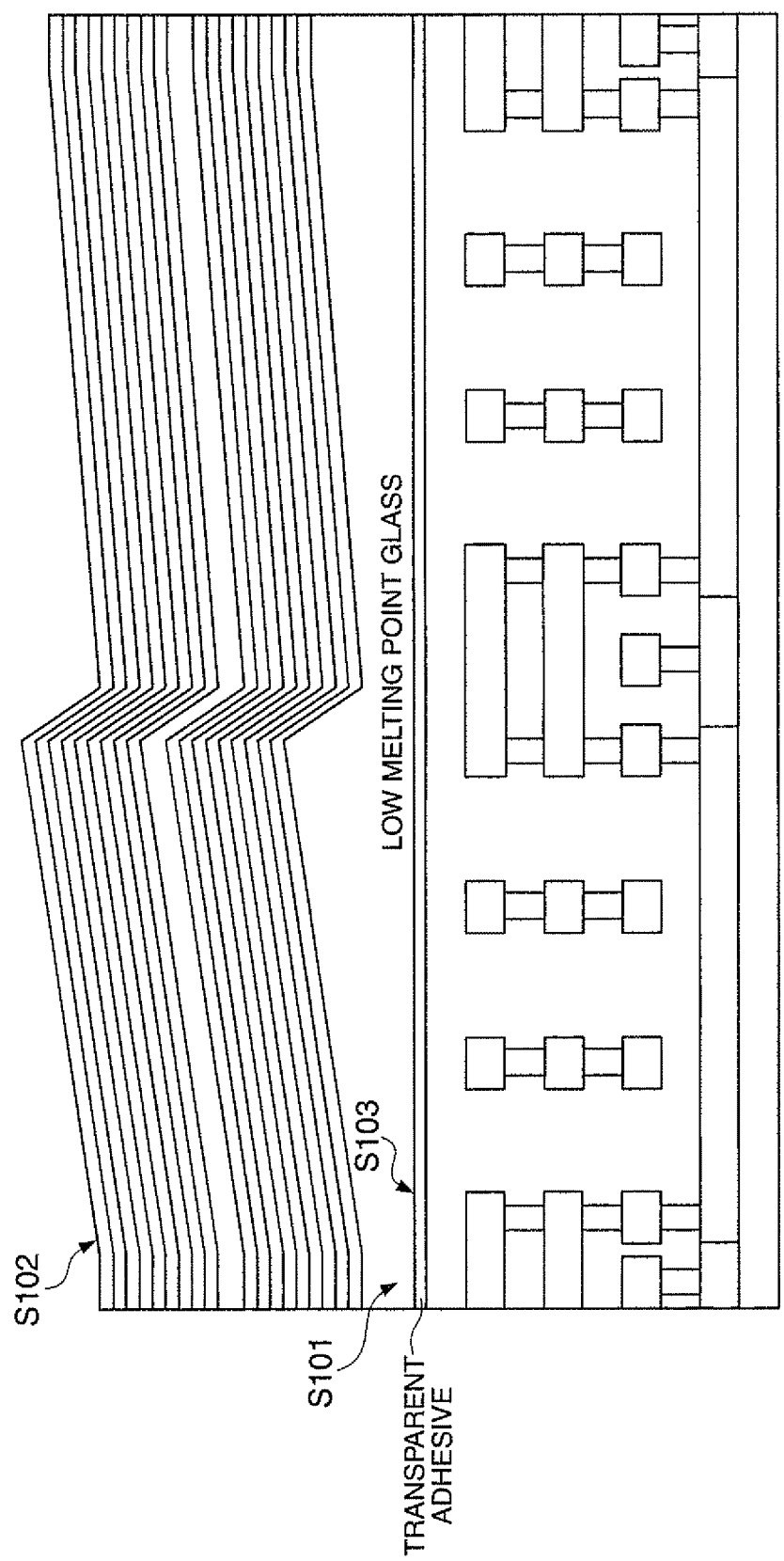
FIG. 17 shows a modified example of a method of manufacturing an optical sensor.

First, as illustrated in S101 shown in FIG. 17, low melting point glass that is melt through heating is injected to a mold, and the low melting point glass is pressed to be molded by using the mold having a tilted face, whereby a tilted structure body is formed.

Next, as illustrated in S102, a multi-layer thin film is formed on the tilted structure body formed from low melting point glass by alternately performing a $TiO_2$ sputtering process and an $SiO_2$ sputtering process.

Next, as illustrated in S103, the tilted structure body in which the multi-layer thin film is formed is bonded to an insulating layer of the angle limiting filter by using an adhesive (an adhesive that is transparent for a wavelength as a spectroscopic target). In addition, the photodiodes and the angle limiting filters are formed through the process of S1 to S8 described above with reference to FIG. 14.

9. Electronic Apparatus

Figure 18:
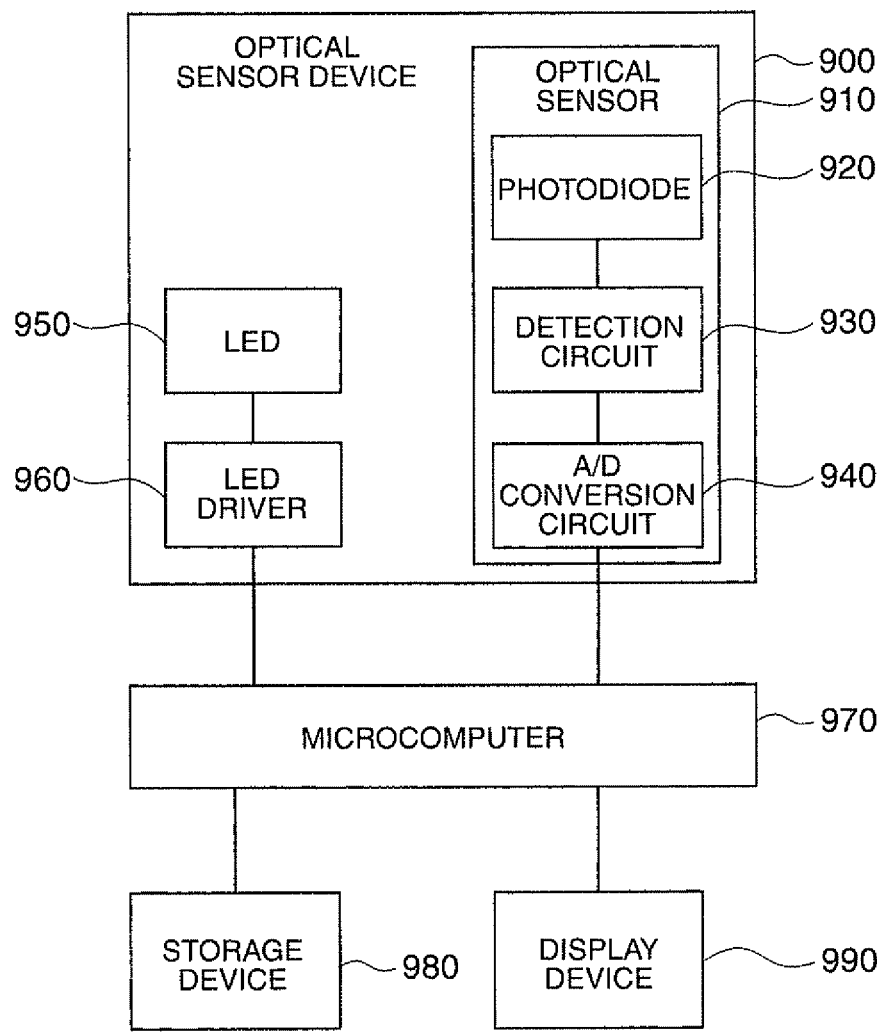
FIG. 18 is a configuration example of an electronic apparatus.

FIG. 18 shows a configuration example of an electronic apparatus that includes the optical sensor according to this embodiment. As examples of the electronic apparatus, there are a pulsimeter, a pulse oximeter, a blood glucose meter, and a saccharimeter. In addition, this embodiment is not limited to the configuration shown in FIG. 18 and, for example, may be used in an elevation angle measuring device, an illuminometer, or the like by omitting the LED 950.

The electronic apparatus shown in FIG. 18 includes an optical sensor device 900, a microcomputer 970 (CPU), a storage device 980, and a display device 990. The optical sensor device 900 includes an LED 950 (light source), an LED driver 960, and an optical sensor 910. The optical sensor 910, for example, is integrated in a one-chip IC and includes a photodiode 920, a detection circuit 930, and an A/D conversion circuit 940.

The LED 950, for example, emits white light onto an observation target. The optical sensor device 900 acquires signals of each wavelength by spectrally dispersing reflection light or transmission light supplied from the observation target. The microcomputer 970 controls the LED driver 960 and acquires signals from the optical sensor 910. The microcomputer 970 displays a display that is based on the acquired signal on the display device 990 (for example, a liquid crystal display device) or stores data that is based on the acquired signal in the storage device 980 (for example a memory or a magnetic disk).

As above, although the embodiments have been described in detail, it can be easily understood by those skilled in the art that many modifications can be made which are not substantially deviated from the new matters and the advantages of the invention. Accordingly, such modified examples belong to the scope of the invention. For example, a term that is described at least once together with another term that has a broad meaning or the same meaning in the descriptions presented here or the figures may be substituted with the another term in any place in the descriptions presented here and the figures. In addition, the configurations and the operations of the optical sensor, the electronic apparatus, and the like are not limited to those described in the embodiment, and various changes can be made therein.

What is claimed is:

1. An optical sensor comprising:
   an impurity region, which is formed on a semiconductor substrate, used for a photodiode; and
   an angle limiting filter that limits an incidence angle of incidence light incident to a light receiving area of the photodiode,
   wherein the angle limiting filter is formed at least by a first plug corresponding to a first insulating layer and a second plug corresponding to a second insulating layer that is located in an upper layer of the first insulating layer, and
   wherein, in a case where a wavelength of the incidence light is denoted by $\lambda$, a gap area having a gap space that is equal to or less than $\lambda/2$ is arranged between the first plug and the second plug.

2. The optical sensor according to claim 1,
   wherein the first insulating layer is an insulating layer that is disposed between a first metal layer and a second metal layer that is located in an upper layer of the first metal layer,
   wherein the second insulating layer is an insulating layer that is disposed between the second metal layer and a third metal layer that is located in an upper layer of the second metal layer, and
   wherein the second metal layer is a metal layer having a thickness larger than that of the first metal layer.

3. The optical sensor according to claim 2, further comprising a processing circuit that is a circuit processing an output signal of the photodiode and of which a wiring is formed at least by the first to third metal layers and the first and second plugs,
   wherein the first plug and the second plug that form the angle limiting filter are formed through a process of forming a wiring layer of the processing circuit.

4. The optical sensor according to claim 3,
   wherein the processing circuit includes a capacitor having an MIM (Metal Insulator Metal) structure that is formed in the second insulating layer corresponding to the second plug.

5. The optical sensor according to claim 4,
   wherein the capacitor having the MIM structure is a capacitor that has the second metal layer as a lower electrode and has a metal layer that is formed between the second metal layer and the third metal layer as an upper electrode.

6. The optical sensor according to claim 1,
wherein the first plug and the second plug that form the angle limiting filter are light shielding materials formed through a semiconductor process on the impurity region for the photodiode.

7. The optical sensor according to claim 1,
wherein, in a case where a height of the angle limiting filter is denoted by R, and a width of an opening of the angle limiting filter is denoted by d, "$d^2/\lambda R \geq 2$" is satisfied.

8. The optical sensor according to claim 1, further comprising an optical band pass filter that transmits light of a specific wavelength out of the incidence light.

9. The optical sensor according to claim 8,
wherein the optical band pass filter is formed by a multi-layer thin film that is tilted at an angle corresponding to a transmission wavelength with respect to a light receiving face of the photodiode.

10. The optical sensor according to claim 9,
wherein the optical band pass filter is formed by a plurality of sets of multi-layer thin films having mutually different transmission wavelengths, and
wherein the plurality of sets of multi-layer thin films has tilt angles with respect to the light receiving face in accordance with the transmission wavelengths and is formed through a simultaneous thin-film forming process.

11. The optical sensor according to claim 1,
wherein the optical sensor is a spectroscopic sensor that is used for spectrally dispersing the incidence light.

12. The optical sensor according to claim 1,
wherein the optical sensor is an illuminance sensor that is used for measuring illuminance of the incidence light.

13. The optical sensor according to claim 1,
wherein the optical sensor is an elevation angle sensor that is used for measuring an elevation angle of a light source.

14. An electronic apparatus comprising:
the optical sensor according to claim 1.

15. An electronic apparatus comprising:
the optical sensor according to claim 2.

16. An electronic apparatus comprising:
the optical sensor according to claim 3.

17. An electronic apparatus comprising:
the optical sensor according to claim 4.

18. An electronic apparatus comprising:
the optical sensor according to claim 5.

19. An electronic apparatus comprising:
the optical sensor according to claim 6.

20. An electronic apparatus comprising:
the optical sensor according to claim 7.

\* \* \* \* \*